(12) United States Patent
Lin et al.

(10) Patent No.: US 11,437,304 B2
(45) Date of Patent: Sep. 6, 2022

(54) SUBSTRATE STRUCTURES AND METHODS OF MANUFACTURE

(71) Applicant: SEMICONDUCTOR COMPONENTS INDUSTRIES, LLC, Phoenix, AZ (US)

(72) Inventors: Yusheng Lin, Phoenix, AZ (US); Roger Paul Stout, Chandler, AZ (US); Chee Hiong Chew, Seremban (MY); Sadamichi Takakusaki, Ota (JP); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 874 days.

(21) Appl. No.: 15/440,967

(22) Filed: Feb. 23, 2017

(65) Prior Publication Data
US 2017/0162481 A1 Jun. 8, 2017

Related U.S. Application Data

(60) Continuation-in-part of application No. 15/206,574, filed on Jul. 11, 2016, now Pat. No. 9,883,595, which
(Continued)

(51) Int. Cl.
*H01L 23/495* (2006.01)
*H01L 23/14* (2006.01)
(Continued)

(52) U.S. Cl.
CPC ...... *H01L 23/49548* (2013.01); *C04B 37/021* (2013.01); *H01L 21/565* (2013.01);
(Continued)

(58) Field of Classification Search
CPC ... H01L 23/142; H01L 23/15; H01L 23/3672; H01L 23/3736; H01L 23/49568;
(Continued)

(56) References Cited

U.S. PATENT DOCUMENTS 5,497,033 A 3/1996 Fillion et al.
6,254,971 B1 * 7/2001 Katayose ............. H01L 23/142
174/258
(Continued)

FOREIGN PATENT DOCUMENTS

DE 102009033029 A1 1/2011
DE 102012206758 B3 5/2013
(Continued)

*Primary Examiner* — Julio J Maldonado
*Assistant Examiner* — Molly K Reida
(74) *Attorney, Agent, or Firm* — Adam R. Stephenson, Ltd.

(57) ABSTRACT

Implementations of semiconductor packages may include a metallic baseplate, a first insulative layer coupled to the metallic baseplate, a first plurality of metallic traces, each metallic trace of the first plurality of metallic traces coupled to the electrically insulative, one or more semiconductor devices coupled to each one of the first plurality of metallic traces, a second plurality of metallic traces coupled to the one or more semiconductor devices, and a second insulative layer coupled to the metallic traces of the second plurality of metallic traces.

8 Claims, 21 Drawing Sheets

Related U.S. Application Data is a division of application No. 14/534,482, filed on Nov. 6, 2014, now Pat. No. 9,408,301.

(51) Int. Cl.
| | |
|---|---|
| *H01L 23/31* | (2006.01) |
| *H01L 21/56* | (2006.01) |
| *H01L 23/00* | (2006.01) |
| *H01L 23/15* | (2006.01) |
| *C04B 37/02* | (2006.01) |
| *H01L 23/373* | (2006.01) |
| *H01L 23/538* | (2006.01) |
| *H01L 21/48* | (2006.01) |

(52) U.S. Cl.
CPC ............ *H01L 23/142* (2013.01); *H01L 23/15* (2013.01); *H01L 23/3107* (2013.01); *H01L 23/3121* (2013.01); *H01L 23/3735* (2013.01); *H01L 23/49568* (2013.01); *H01L 23/49575* (2013.01); *H01L 23/5385* (2013.01); *H01L 24/72* (2013.01); *C04B 2237/34* (2013.01); *C04B 2237/343* (2013.01); *C04B 2237/402* (2013.01); *C04B 2237/406* (2013.01); *C04B 2237/407* (2013.01); *C04B 2237/52* (2013.01); *C04B 2237/64* (2013.01); *C04B 2237/82* (2013.01); *H01L 21/4857* (2013.01); *H01L 21/4871* (2013.01); *H01L 23/49586* (2013.01); *H01L 23/5389* (2013.01); *H01L 24/19* (2013.01); *H01L 2224/16225* (2013.01); *H01L 2224/29111* (2013.01); *H01L 2224/32245* (2013.01); *H01L 2224/73253* (2013.01); *H01L 2224/83801* (2013.01); *H01L 2924/0002* (2013.01); *H01L 2924/1033* (2013.01); *H01L 2924/10272* (2013.01); *H01L 2924/1203* (2013.01); *H01L 2924/13055* (2013.01); *H01L 2924/13091* (2013.01); *H01L 2924/181* (2013.01)

(58) Field of Classification Search
CPC ............ H01L 23/5283; H01L 23/5385; H01L 23/5389; H01L 21/4857; H01L 21/4871; H01L 25/0655; H01L 25/072
See application file for complete search history.

(56) References Cited

U.S. PATENT DOCUMENTS

| | | | |
|---|---|---|---|
| 6,259,157 | B1 | 7/2001 | Sakamoto et al. |
| 6,593,169 | B2 | 7/2003 | Iimura et al. |
| 7,078,797 | B2 | 7/2006 | Suzuki et al. |
| 7,102,211 | B2 | 9/2006 | Ochiai et al. |
| 7,186,921 | B2 | 3/2007 | Igarashi et al. |
| 7,221,049 | B2 | 5/2007 | Igarashi et al. |
| 7,232,957 | B2 | 6/2007 | Mizutani et al. |
| 7,253,027 | B2 | 8/2007 | Kanakubo |
| 7,315,083 | B2 | 1/2008 | Igarashi et al. |
| 7,491,894 | B2 | 2/2009 | Suzuki et al. |
| 7,501,696 | B2 | 3/2009 | Koyama et al. |
| 7,521,290 | B2 | 4/2009 | Takakusaki et al. |
| 7,714,232 | B2 | 5/2010 | Igarashi et al. |
| 7,935,899 | B2 | 5/2011 | Takukusaki et al. |
| 7,936,569 | B2 | 5/2011 | Takakusaki et al. |
| 7,957,158 | B2 | 6/2011 | Takakusaki et al. |
| 8,120,153 | B1 | 2/2012 | Shen |
| 8,749,052 | B2 | 6/2014 | Schulz-Harder et al. |
| 9,704,819 | B1* | 7/2017 | Gao .................. H01L 22/20 |
| 2004/0222515 | A1 | 11/2004 | Choi et al. |
| 2006/0163648 | A1* | 7/2006 | Hauenstein ......... H01L 23/3735 257/328 |
| 2007/0040186 | A1* | 2/2007 | Fillion ............... H01L 23/4821 257/177 |
| 2007/0145540 | A1* | 6/2007 | Mochida ............ H01L 23/4334 257/659 |

FOREIGN PATENT DOCUMENTS

| | | |
|---|---|---|
| JP | 1999-027470 | 1/1999 |
| JP | 2003-318334 | 11/2003 |
| JP | 2006-237561 | 9/2006 |
| JP | 2007-036013 | 2/2007 |
| JP | 2008-022033 | 2/2008 |

\* cited by examiner

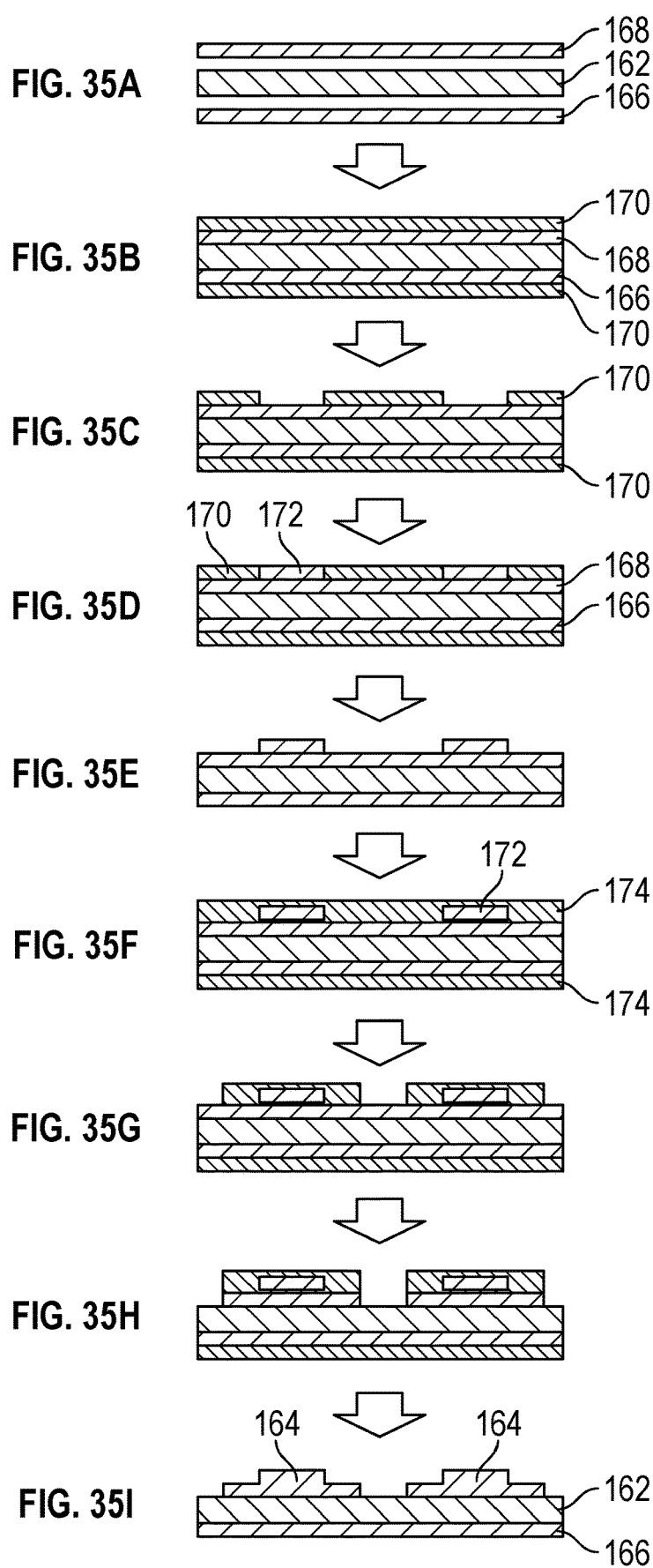

SUBSTRATE STRUCTURES AND METHODS OF MANUFACTURE

CROSS REFERENCE TO RELATED APPLICATIONS

This application is a continuation-in-part of the earlier U.S. Utility patent application to Lin et al. entitled "Substrate Structures and Methods of Manufacture," application Ser. No. 15/206,574, filed Jul. 11, 2016, now pending, which is a divisional application of the earlier U.S. Utility patent application to Lin et al. entitled "Substrate Structures and Methods of Manufacture," application Ser. No. 14/534,482, filed Nov. 6, 2014, now U.S. Pat. No. 9,408,301, issued Aug. 2, 2016, the disclosures of each of which are hereby incorporated entirely herein by reference.

BACKGROUND

1. Technical Field

Aspects of this document relate generally to substrate structures for semiconductor integrated circuit components. More specific implementations involve substrate structures for power modules.

2. Background Art

Substrate structures for semiconductor integrated circuits, such as power modules, are used to route components internal and external to an integrated circuit and to dissipate heat. Direct bonded copper (DBC) substrates include a ceramic layer with a layer of copper bonded to one or both sides. Insulated metal substrate (IMS) substrates include a metal baseplate covered by a thin layer of dielectric (usually an epoxy-based layer) and a layer of copper.

SUMMARY

Implementations of semiconductor packages may include: a metallic baseplate having a first surface and a second surface opposing the first surface; a first insulative layer having a first surface coupled to the second surface of the metallic baseplate, the electrically insulative layer having a second surface opposing the first surface of the electrically insulative layer; a first plurality of metallic traces, each metallic trace of the first plurality of metallic traces coupled to the second surface of the electrically insulative layer at a first surface of the metallic trace, each metallic trace of the first plurality of metallic traces having a second surface opposing the first surface of the metallic trace. Implementations may also include one or more semiconductor devices having a first surface and a second surface opposing the first surface, wherein the first surface of the one or more semiconductor devices are coupled to the second surface of each one of the first plurality of metallic traces; and a second plurality of metallic traces having a first surface and a second surface, wherein the first surface of at least one metallic trace of the second plurality of metallic traces is coupled to the second surface of the one or more semiconductor devices. Various implementations may also include a second insulative layer having a first surface coupled to the second surfaces of the metallic traces of the second plurality of metallic traces.

Implementations of semiconductor packages may include one, all, or any of the following:

A top metallic plate may be coupled to a second surface of the second insulative layer, wherein the second surface of the second insulative layer may be opposite the first surface of the second insulative layer.

The semiconductor devices may include one of an IGBT, diode, MOSFET, SiC device and a GaN device.

The first insulative layer may be one of a ceramic insulated layer and a laminate insulated layer.

The second insulative layer may be one of a ceramic insulated layer and a laminate insulated layer.

The package may not include wire bonds or clips.

The metallic baseplate may be patterned.

The top metallic plate may be patterned.

Implementations of semiconductor packages may include: a third plurality of metallic traces, each metallic trace having a first surface and a second surface opposing the first surface; a first insulative layer having a first surface coupled to the second surface of each metallic trace of the third plurality of metallic traces, the electrically insulative layer having a second surface opposing the first surface of the electrically insulative layer, the first insulative layer further having a plurality of openings therethrough. Implementations may also include a first plurality of metallic traces, each metallic trace of the first plurality of metallic traces coupled to the second surface of the electrically insulative layer at a first surface of each metallic trace, each metallic trace of the first plurality of metallic traces having a second surface opposing the first surface of each metallic trace, wherein one or more of the metallic traces of the first plurality of metallic traces are electrically coupled to the third plurality of metallic traces through the openings in the first insulative layer; and one or more semiconductor devices having a first surface and a second surface opposing the first surface, wherein the first surface of the one or more semiconductor devices are coupled to the second surface of one or more metallic traces of the first plurality of metallic traces. Implementations may include a second plurality of metallic traces having a first surface and a second surface, wherein the first surface of at least one metallic trace of the second plurality of metallic traces is coupled to the second surface of the one or more semiconductor devices; a second insulative layer having a first surface coupled to the second surface of the second plurality of metallic traces, the second insulative layer having a second surface opposing the first surface, the second insulative layer having a plurality of openings therethrough; and a fourth plurality of metallic traces, each metallic trace of the fourth plurality of metallic traces having a first surface coupled to the second surface of the second insulative layer, wherein the fourth plurality of metallic traces is electrically coupled to one or more metallic traces of the second plurality of metallic traces through the plurality of openings in the second insulative layer.

Implementations of semiconductor packages may include one, all, or any of the following:

The openings through the first and second insulative layers may be plated through holes.

The openings through the first and second insulative layers may be vias.

The package may not have wire bonds or clips.

The package may be encapsulated with an encapsulant using compression molding.

The first insulative layer may be one of a ceramic insulative layer and a laminate insulative layer.

The second insulative layer may be one of a ceramic insulative layer and a laminate insulative layer.

Implementations of semiconductor packages may include: a lead frame coupled to a first surface of one or more semiconductor devices, the one or more semiconductor devices further having a second surface opposing the first surface; and a clip having a first surface and a second surface opposing the first surface, wherein the first surface of the clip is coupled to the second surface of the one or more semiconductor devices. Implementations may include a metallic layer having a first surface coupled to the second surface of the clip, the metallic layer further having a second surface opposing the first surface; and an insulative layer having a first surface coupled to the second surface of the metallic layer.

Implementations of power electronic substrates may include one, all, or any of the following:

A top metallic plate may be coupled to a second surface of the insulative material, wherein the second surface of the insulative material opposes the first surface of the insulative material, wherein the top metallic plate may be configured to transfer heat to a heat sink.

The semiconductor devices may include one of an IGBT, diode, MOSFET, a SiC device and a GaN device.

The metallic layer may be patterned and configured to electrically couple with a motherboard.

The top metallic plate may be patterned.

Implementations of semiconductor packages may include a lead frame coupled to a first surface of one or more semiconductor devices where each of the one or more semiconductor devices further includes a second surface opposing the first surface. A metallic layer including a first surface and a second surface opposing the first surface may be included where the metallic layer further includes a first plurality of traces in the first surface. A insulative layer may be included which includes a first surface coupled to the second surface of the metallic layer. A first portion of the first plurality of traces may include a first thickness and a second portion of the first plurality of traces may include a second thickness where the first thickness and the second thickness are both measured perpendicular to the second surface of the metallic layer. The second thickness may be greater than the first thickness. The second surface of each of the one or more semiconductor devices may be coupled with the first portion of the first plurality of traces. The leadframe may be coupled with the second portion of the first plurality of traces.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIGS. 35A-35I are views of a process flow for forming the multiple thickness substrate structure of FIG. 33;

DESCRIPTION

This disclosure, its aspects and implementations, are not limited to the specific components, assembly procedures or method elements disclosed herein. Many additional components, assembly procedures and/or method elements known in the art consistent with the intended substrate structures and methods of manufacture will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such substrate structures and methods of manufacture, and implementing components and methods, consistent with the intended operation and methods.

Figure 1:
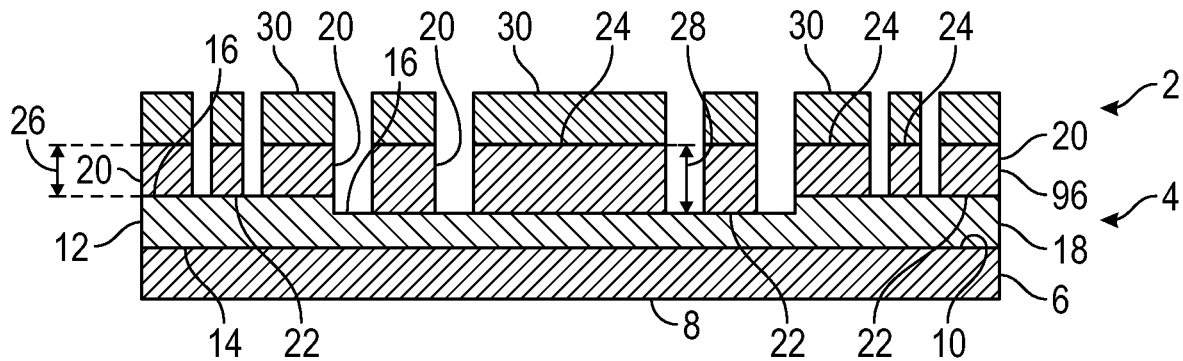
FIG. 1 is a cross-section view of an implementation of an insulated metal substrate (IMS)

Referring now to FIG. 1, an implementation of a power electronic substrate 2 is illustrated that includes an insulated metal substrate (IMS) 4. The IMS 4 has a metallic baseplate 6 which may be formed of, by non-limiting example, aluminum, copper, steel, and other heat-conducting materials. The metallic baseplate 6 has a first surface 8 which is configured to couple to, by non-limiting example, a heat sink, a motherboard, and the like. The metallic baseplate 6 has a second surface 10 on an opposite (opposing) side from the first surface 8.

A dielectric layer 12 is coupled to the metallic baseplate 6. The dielectric layer 12 has a first surface 14 which is coupled to the second surface 10 of the metallic baseplate 6 and a second surface 16 on an opposite side of the dielectric layer 12 from the first surface 14. In various implementations the dielectric layer 12 includes a resin or epoxy 18, though in other implementations it may include other dielectric (electrically insulative) materials.

Figure 7:
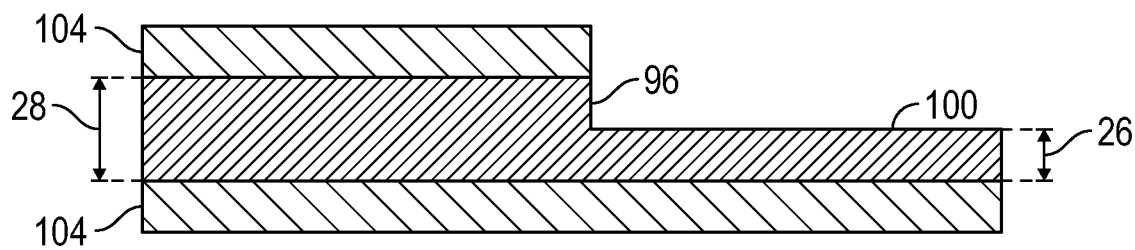
FIG. 7 is a cross-section view of the elements of FIG. 6 with a pattern etched into the copper layer.
Figure 8:
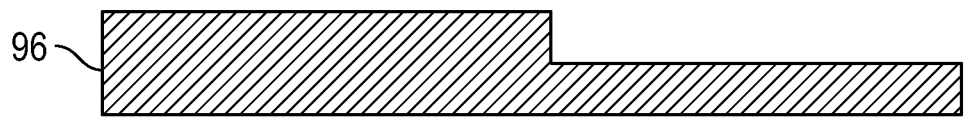
FIG. 8 is a cross-section view of the copper layer of FIG. 7 with the photoresist layers removed.
Figure 9:
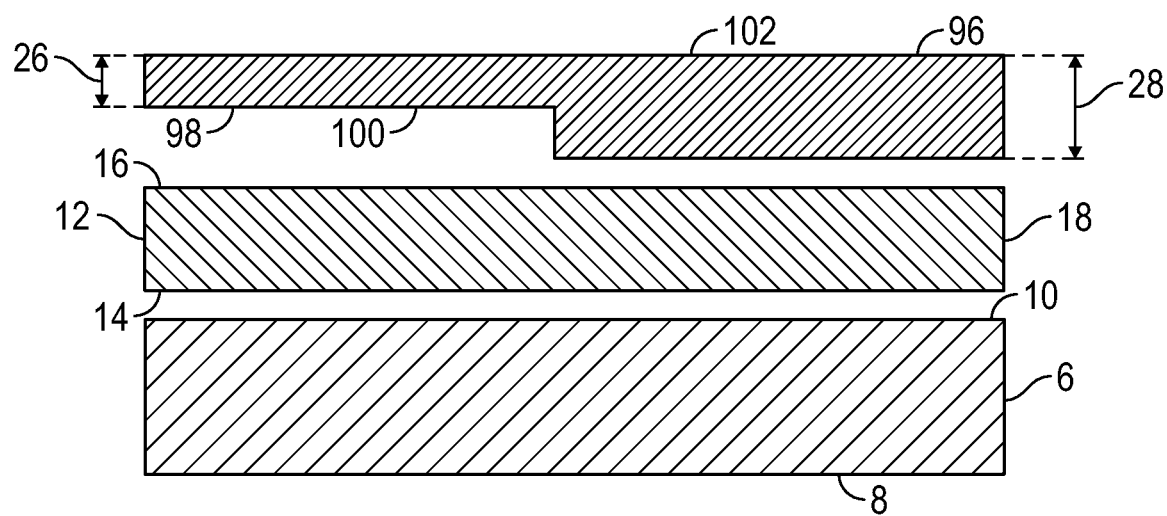
FIG. 9 is a cross-section view of the copper layer of FIG. 8, a dielectric layer and a metallic baseplate of an IMS prior to being coupled together.
Figure 17:
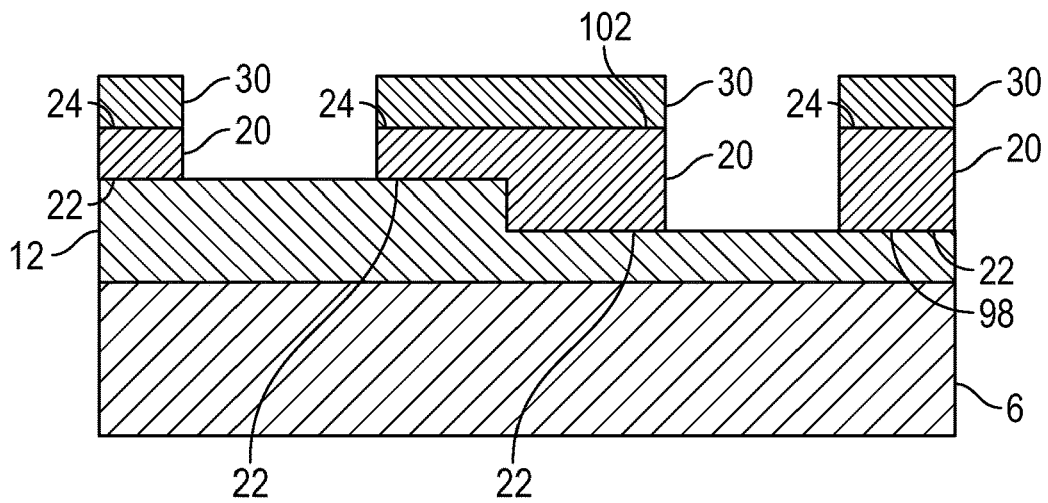
FIG. 17 is a cross-section view of the elements of FIG. 16 with the nickel plating and copper layer having been etched through at the pattern in the second layer of photoresist and the second layer of photoresist then removed.
Figure 18:
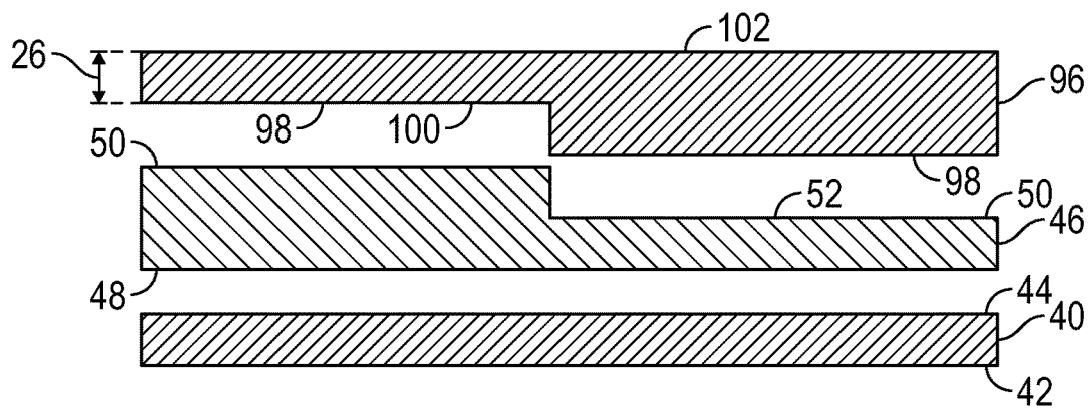
FIG. 18 is a cross-section view of the copper layer of FIG. 8 having a pattern thereon, a ceramic layer having a complementary pattern, and a metallic base plate of a DBC substrate prior to being coupled together.

A plurality of traces 20 are formed and coupled to the dielectric layer 12. Each trace 20 has a first surface 22 coupled to the second surface 16 of the dielectric layer 12 and a first surface 22 on an opposite side of the trace 20 from the first surface 22. The traces 20 are metallic and may be formed of, by non-limiting example, copper, aluminum, or other electrically conductive materials. Some of the traces 20 have a first thickness 26, measured from the first surface 22 to the second surface 24, and some of the traces 20 have a second thickness 28, greater than the first thickness 26, measured from the first surface 22 to the second surface 24. In some implementations there could be traces 20 having a third thickness sized differently from both the first thickness 26 and second thickness 28 or other traces that contain both the first thickness and the second thickness. Referring to FIGS. 7-9, the difference in thicknesses is created at least in part by a pattern 100 which is formed in a first surface 98 of a copper layer 96 from which the traces 20 are formed, which will be discussed hereafter, and the traces 20 which have the smaller first thickness 26 correspond with the pattern 100 or, in other words, are located at the pattern 100 or formed of the material that composes the pattern 100. Referring back to FIG. 1, a layer of nickel 30 is included on the second surface 24 of each metallic trace 20. In implementations a single trace 20 may have different thicknesses in different places and so may include the first thickness 26, second thickness 28, a third thickness, and so on. A trace 20 of this nature is illustrated in FIG. 17.

Figure 2:
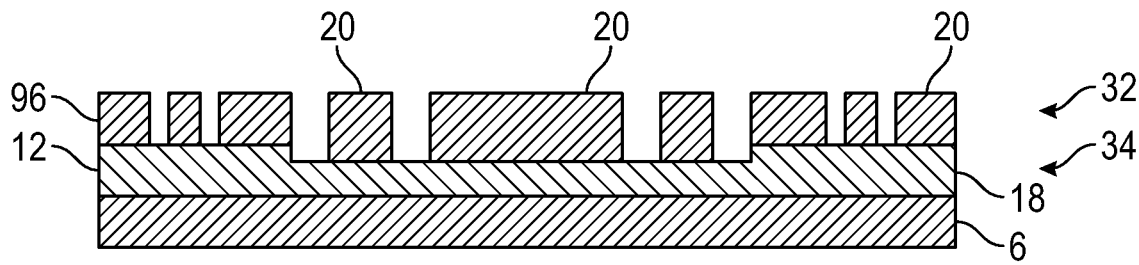
FIG. 2 is a cross-section view of another implementation of an IMS.

Referring now to FIG. 2, in particular implementations a power electronic substrate 32 is an IMS 34 that is similar in structure to IMS 4 except the traces lack the nickel 30 atop the traces 20.

Figure 3:
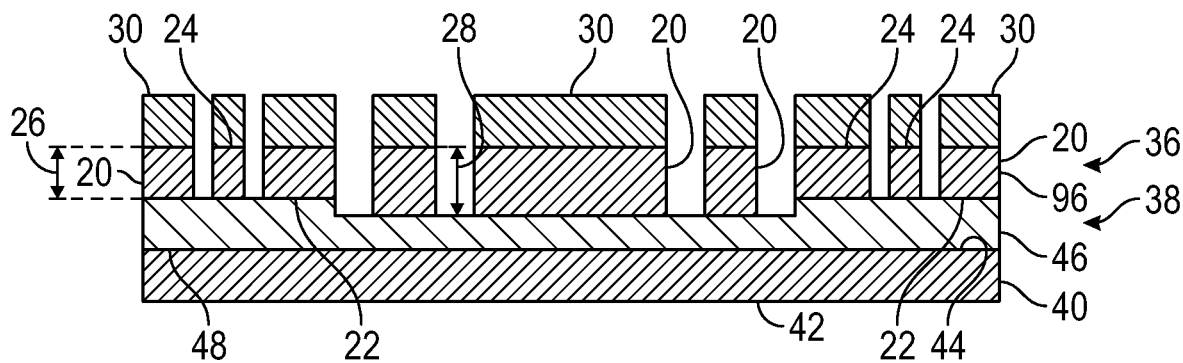
FIG. 3 is a cross-section view of an implementation of a direct bonded copper (DBC) substrate.
Figure 4:
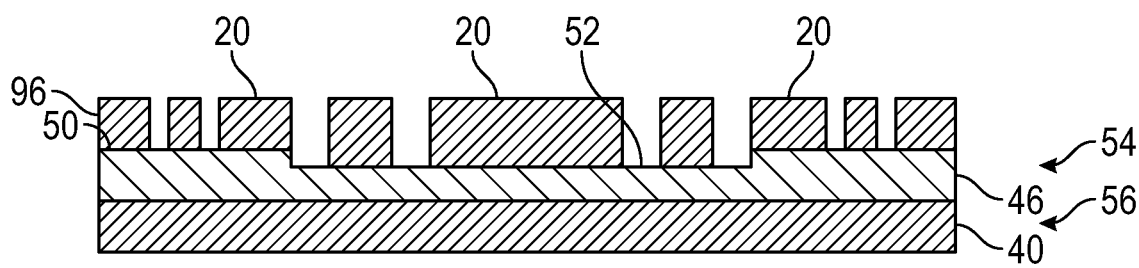
FIG. 4 is a cross-section view of another implementation of a DBC substrate.
Figure 5:
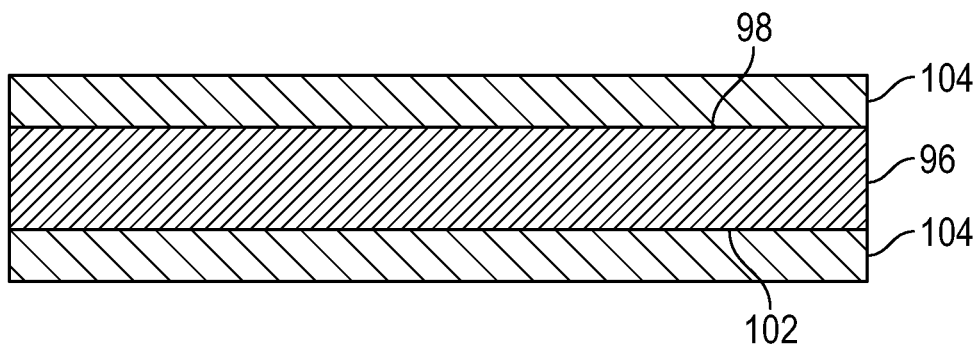
FIG. 5 is a cross-section view of a copper layer having photoresist layers thereon

Referring now to FIGS. 3 and 4, implementations of a power electronic substrate 36 that are direct bonded copper (DBC) substrates are illustrated. The DBC substrate 38 has a metallic baseplate 40 which may be formed of, by non-limiting example, copper, aluminum, steel, and the like. The metallic baseplate 40 has a first surface 42 configured to be coupled to, by non-limiting example, a heat sink, a motherboard, and the like, and further has a second surface 44 on an opposite side of the metallic baseplate 40 from the first surface 42. A first surface 48 of a ceramic layer 46 is coupled to the second surface 44 of the metallic baseplate 40. The ceramic layer 46 has a second surface 50 on an opposite side of the ceramic layer 46 from the first surface 48. A pattern 52 is formed in the second surface 50 of the ceramic layer 46 which may be formed, by non-limiting example, with a number of patterning techniques used to etch and shape ceramic materials. The ceramic layer 46 may be half-etched, though in implementations the etching may go more or less than halfway through the ceramic layer 46. The etching may be accomplished through wet-etching techniques. In other implementations, the ceramic layer 46 may be patterned through printing, molding, or stamping when the ceramic material is still soft and pliable before curing, firing, or sintering of the layer has taken place.

The DBC substrate 38 has a plurality of traces 20 similar to IMS 4. The traces 20 having the larger second thickness 28, measured between the first surface 22 and second surface 24, correspond with the pattern 52, or in other words are located at or formed from the pattern 52. A layer of nickel 30 is placed atop each trace 20, similar to IMS 4, which may be plated onto the traces 20.

Referring now to FIG. 4, in implementations a power electronic substrate 54 is a DBC substrate 56 that is similar to DBC substrate 38 except it lacks the nickel layer 30.

Figure 6:
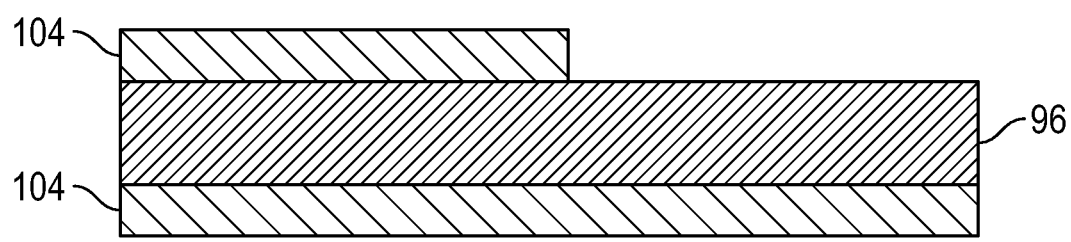
FIG. 6 is a cross-section view of the elements of FIG. 5 with a pattern formed in one of the photoresist layers.

Referring now to FIGS. 5-17, a method of forming an IMS 4 is illustrated. A copper layer 96 is first processed where the copper layer 96 has a first surface 98 and a second surface 102 on an opposite side of the copper layer 96 from the first surface 98. A layer of photoresist 104 is placed on the first surface 98 and another layer of photoresist 104 is placed on the second surface 102. A pattern is formed in the photoresist 104 on the first surface 98, as seen in FIG. 6. This may be done by exposing a portion of the photoresist 104 to ultraviolet (UV) light or other exposure techniques which make a portion of the photoresist 104 more resistant (or more susceptible) to being removed, and then developing the photoresist 104 with a solution that removes the treated (or untreated) portion to form the pattern.

While only a single part of the pattern is shown, it may be understood that FIG. 6 is a close-up view of only a portion of the elements, and that in reality a pattern of traces and other shapes may be formed in the photoresist 104. An etching process is then used to etch a pattern 100 into the first surface 98 of the copper layer 96 through the spaces formed in the photoresist 104. This may be done using any conventional etching mechanisms used to etch copper. The formation of the pattern 100 forms locations of the copper layer 96 that have the first thickness 26 and other locations that have the second thickness 28, the smaller first thickness 26 corresponding with the patterned areas where the first surface 98 has been etched. It can be seen from FIG. 7 that the etching of the copper layer 96 is a partial etch which does not go all the way through to the second surface 102. In some implementations, the etching may be half-etched. In other implementations, the pattern 100 may be etched more or less than halfway through the copper layer 96.

Referring now to FIG. 8, after the pattern 100 has been etched into the first surface 98 the layers of photoresist 104 are removed. It may be understood that the layer of photoresist 104 that was placed on the second surface 102 is used to prevent the second surface 102 from being etched during the etching process—such as, for instance, in cases where the etching was done with wet etching where the entire copper layer 96 was placed in an etching solution. Any of a wide variety of conventional methods for removing the photoresist 104 (ashing, solvent cleaning, etc.) may be employed in various implementations.

Referring now to FIG. 9, a metallic baseplate 6 is illustrated that has a first surface 8 and second surface 10 as previously described. A dielectric layer 12 having first surface 14 and second surface 16 is also provided, which in the implementation shown includes an epoxy 18. The copper layer 96 is positioned so that its first surface 98 faces the second surface 16 of the dielectric layer 12.

Figure 10:
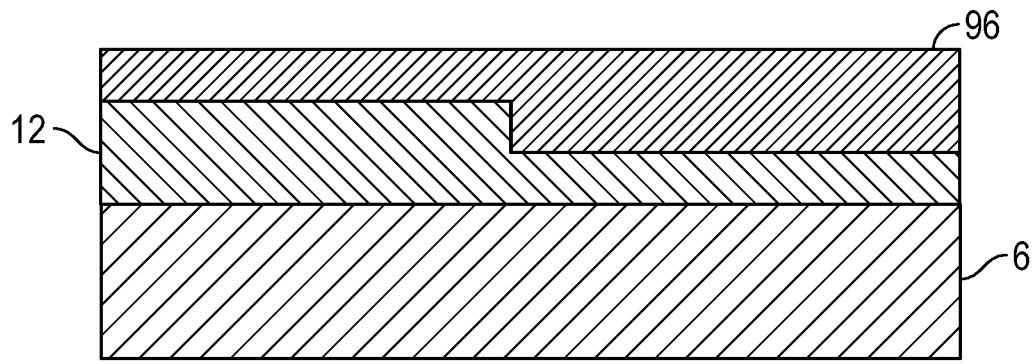
FIG. 10 is a cross-section view of the elements of FIG. 9 coupled together.

Referring now to FIG. 10, the copper layer 96, dielectric layer 12, and metallic baseplate 6 are illustrated after having been coupled together through a laminating or other pressure bonding process that presses the layers together. During the bonding step, the dielectric layer 12 flows under the pressure forces during this step of assembly and accommodates the pattern 100, as seen in FIG. 10, embedding the pattern 100 into the dielectric layer 12. This bonding/laminating step forms a complementary, or substantially complementary pattern, to the pattern 100 in the dielectric layer 12.

Figure 11:
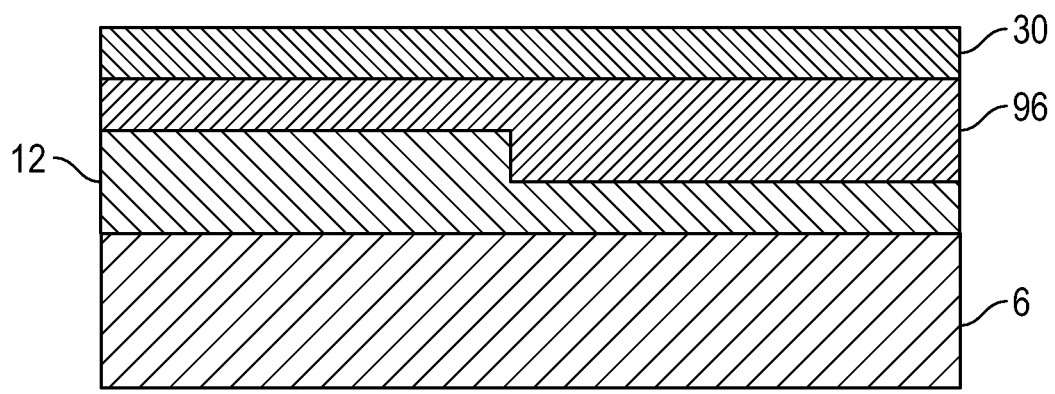
FIG. 11 is a cross-section view of the elements of FIG. 10 with nickel plating atop the copper layer.
Figure 12:
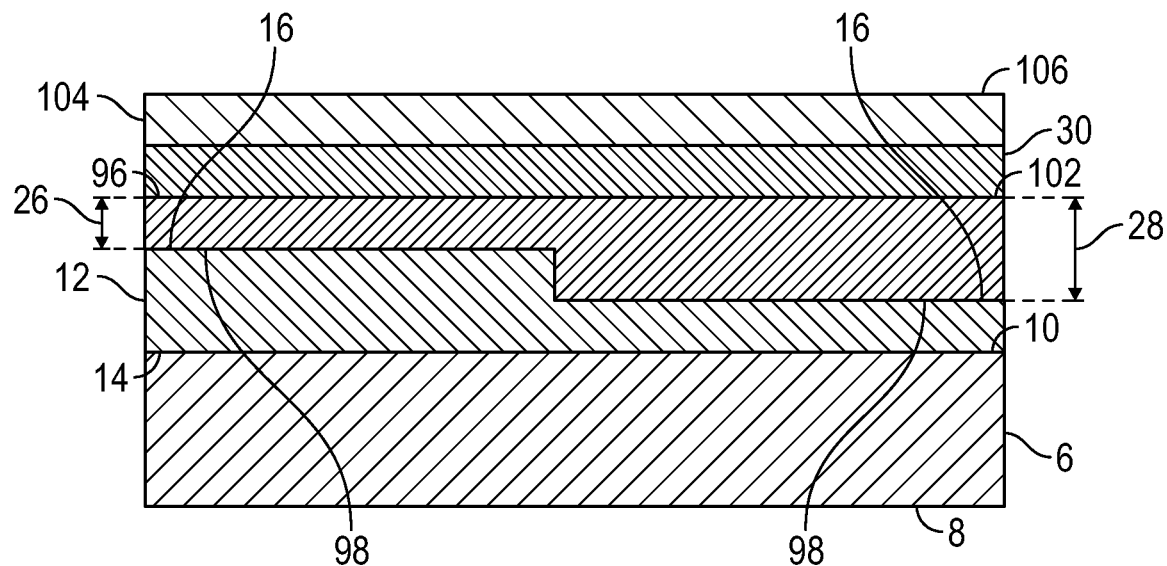
FIG. 12 is a cross-section view of the elements of FIG. 11 with a first layer of photoresist placed atop the nickel plating.
Figure 13:
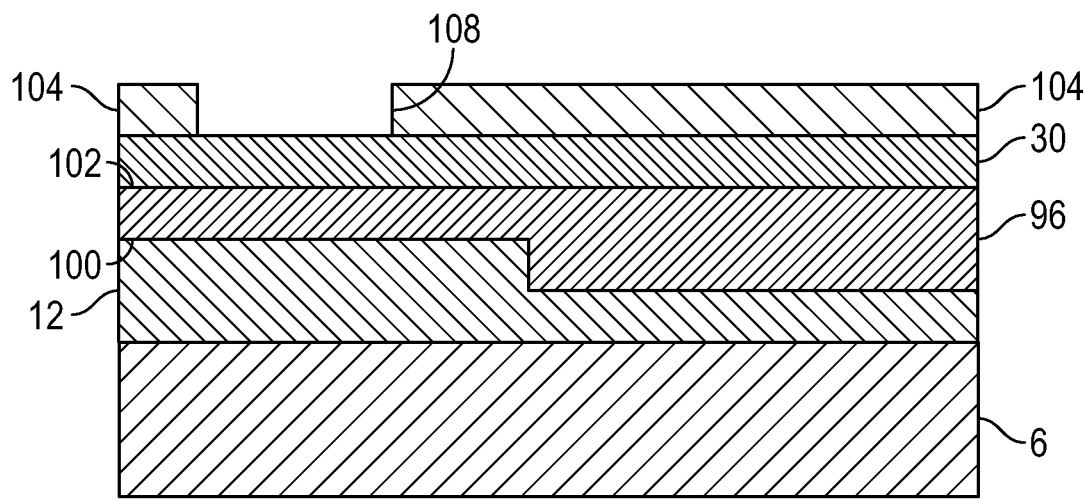
FIG. 13 is a cross-section view of the elements of FIG. 12 with a pattern formed in the layer of photoresist.
Figure 14:
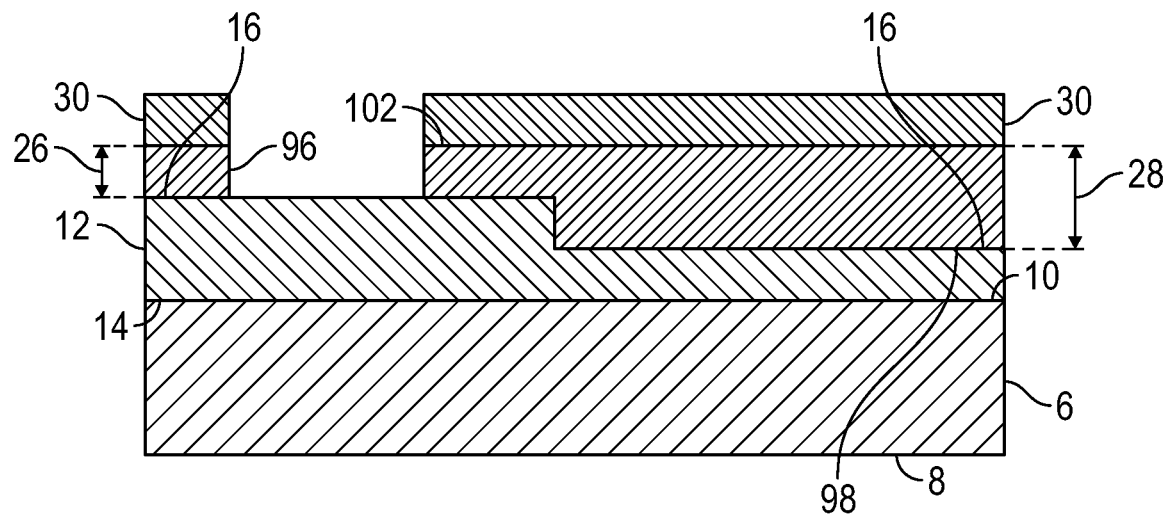
FIG. 14 is a cross-section view of the elements of FIG. 12 with the nickel plating and copper layer having been etched through at the pattern in the first layer of photoresist and the first layer of photoresist then removed.

Referring to FIG. 11, a layer of nickel 30 is plated or otherwise deposited onto the copper layer 96. As illustrated in FIGS. 12-14, a first layer 106 of photoresist 104 is placed atop the nickel 30 and a pattern 108 is formed therein. While only one space of the pattern 108 is shown, it may be understood that this is a close-up view showing only a small portion of the elements, so that in reality a number of patterned areas may be formed in the first layer 106 of photoresist 104. The nickel plating 30 and copper layer 96 are then fully etched down to the dielectric layer 12 at the pattern 108 and then the first layer 106 of photoresist 104 is removed, as seen in FIG. 14.

Figure 15:
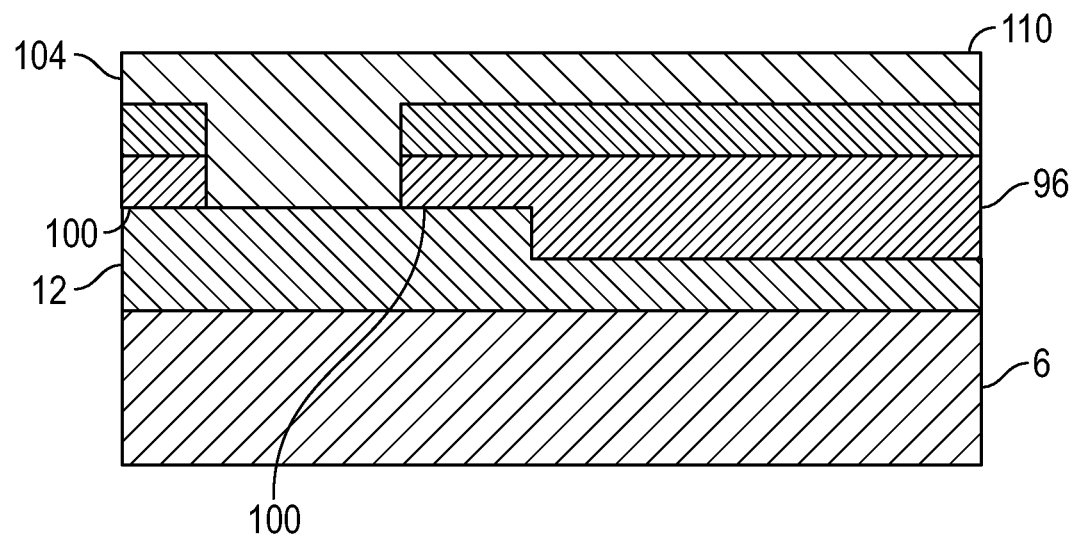
FIG. 15 is a cross-section view of the elements of FIG. 14 with a second layer of photoresist placed thereon.
Figure 16:
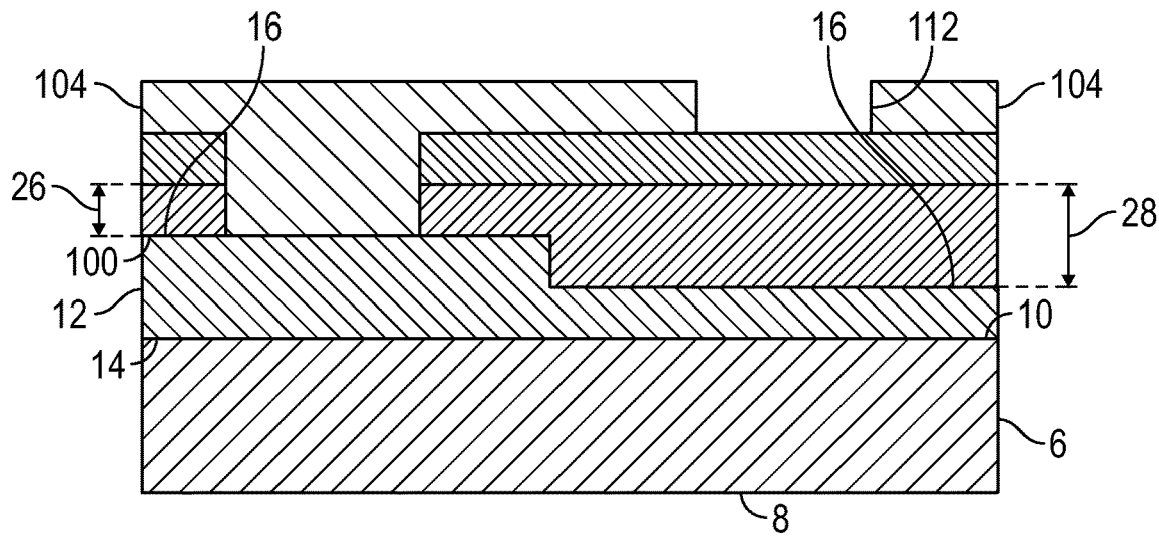
FIG. 16 is a cross-section view of the elements of FIG. 15 with a pattern formed in the second layer of photoresist.

A second layer 110 of photoresist 104 is then coated onto the elements as shown in FIG. 15 and a second pattern 112 is formed therein. Although only a single space of the pattern 112 is shown, it may be understood that a number of spaces may be formed therein. The nickel layer 30 and copper layer 96 are then fully etched through down to the dielectric layer at the pattern 112 to form the traces 20 and the second layer 110 of photoresist 104 is removed. Some of the traces 20 have the first thickness 26 and some have the second thickness 28—and in the implementation shown some have both the first thickness 26 and second thickness 28.

It may be perceived that a slightly modified version of this process may be used to form IMS 34 illustrated in FIG. 2, wherein the step of adding the nickel 30 is unnecessary and the etching processes to form the traces 20 accordingly do not involve etching through the nickel 30. It may also be understood that the process could be slightly modified to form traces 20 of more than two thicknesses. By non-limiting example, layers of photoresist 104 could be coated onto the copper layer 96 shown in FIG. 8, a pattern formed therein, and an etching process may then be used to etch a second pattern into the copper layer 96, which if etched to a different depth in the copper layer 96, may be used to form a third thickness in the copper layer 96 different than the first thickness 26 and second thickness 28. This process could be repeated numerous times to form many thicknesses in the copper layer 96. This may be done with the second surface 16 of the copper layer 96 remaining flat and, accordingly, the remaining process steps are identical or fairly identical to those described previously.

Figure 19:
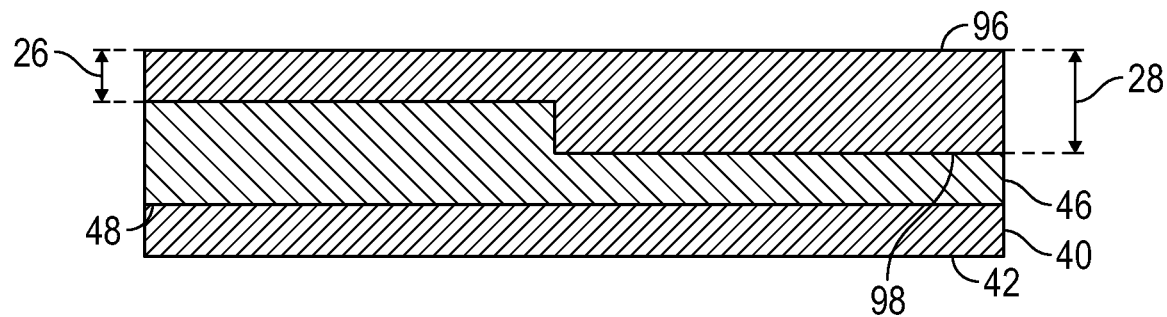
FIG. 19 is a cross-section view of the elements of FIG. 18 coupled together.
Figure 20:
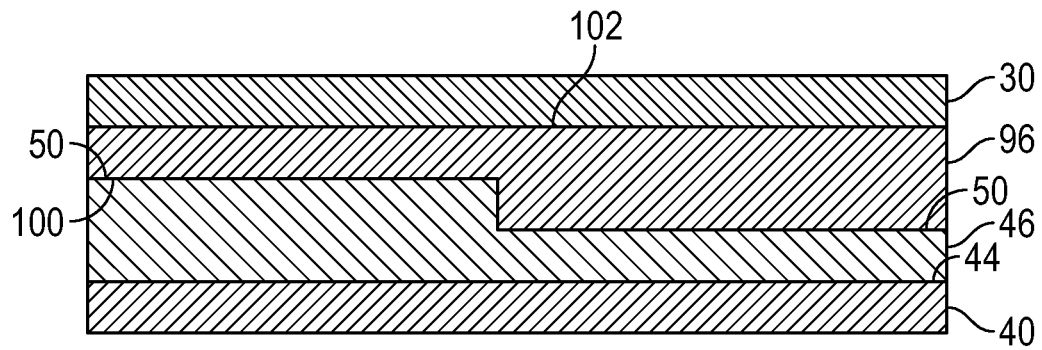
FIG. 20 is a cross-section view of the elements of FIG. 19 with a layer of nickel plated onto the copper layer.
Figure 21:
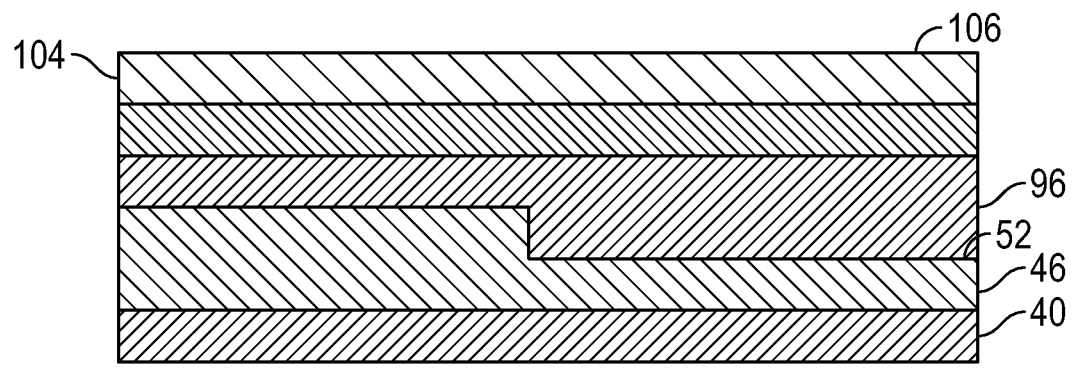
FIG. 21 is a cross-section view of the elements of FIG. 20 with a first layer of photoresist placed atop the nickel plating.
Figure 22:
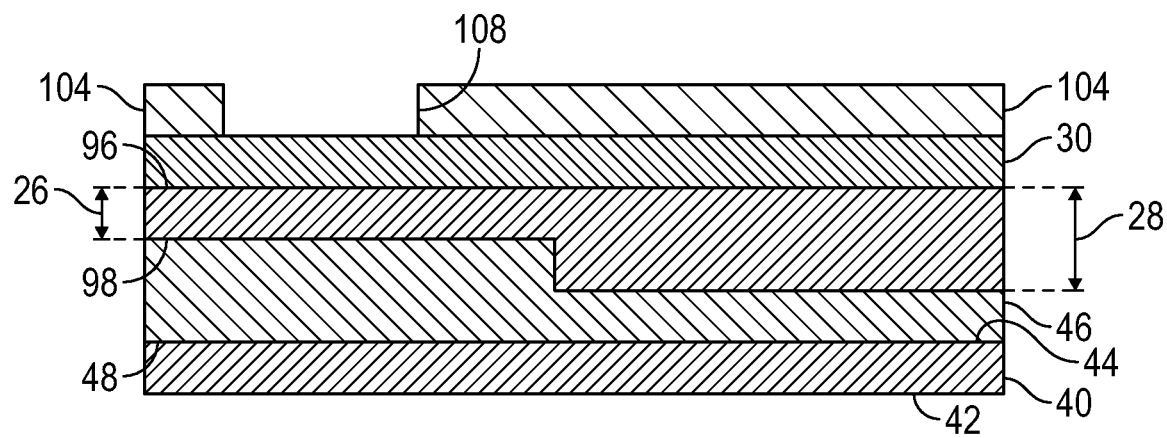
FIG. 22 is a cross-section view of the elements of FIG. 21 with a pattern formed in the first layer of photoresist.
Figure 23:
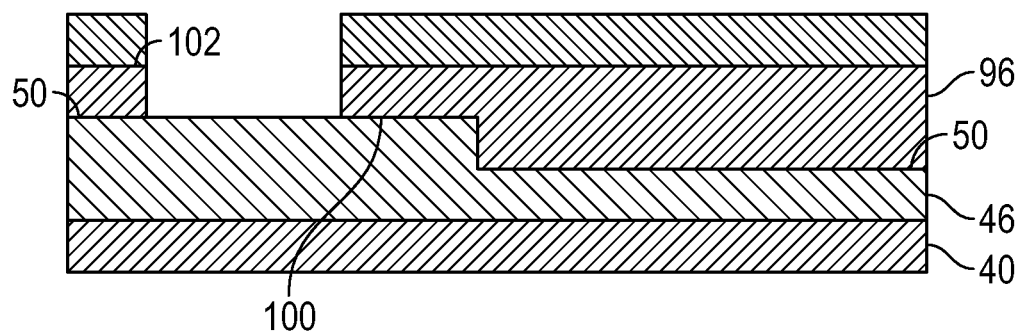
FIG. 23 is a cross-section view of the elements of FIG. 22 with the nickel and copper layers having been etched through at the pattern in the first layer of photoresist and the first layer of photoresist having being removed.

FIGS. 18-26 show a process of forming DBC substrate 38, which in some aspects is similar to the process described above for forming IMS 4, as it involves patterning a layer of copper as was previously described for use in subsequent processing. As A pattern 100 is formed in the first surface 98 of the copper layer 96 as already described in this document. With respect to shaping the ceramic layer, a pattern 52 is formed in the second surface 50 of the ceramic layer 46 which is complementary, or substantially complementary, to the pattern 100 in the copper layer 96. The pattern 52 in the ceramic layer 46 may be formed using any of a variety of techniques for etching or shaping ceramic materials, including photoresist masking and dry or wet etching, or through stamping/forming processes prior to the ceramic material being cured/dried/fired/sintered. As shown in FIG. 19, the copper layer 96, ceramic layer 46 and metallic baseplate 40 are bonded together through a sintering or other similar process used to form intermetallic or other bonding layers between the copper and the ceramic material. A layer of nickel 30 is coupled atop the copper layer 96, through electroplating or deposition as shown in FIG. 20, and atop this a first layer 106 of photoresist 104 is added as shown in FIG. 21. A pattern 108 is formed in the first layer 106, as shown in FIG. 22. As described above, although only a single space is formed there may be a plurality of spaces in the pattern 108. The nickel 30 and copper layer 96 are fully etched through at the gap 108, revealing the ceramic layer 46, and the first layer 106 of photoresist 104 is then removed, as illustrated in FIG. 23.

Figure 24:
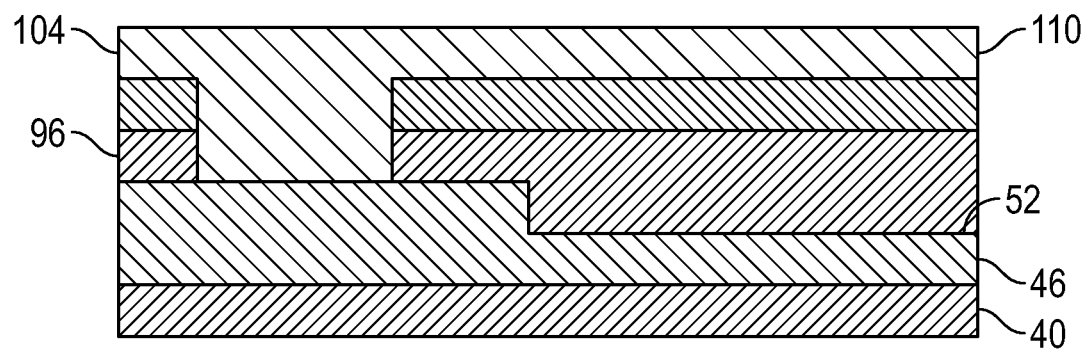
FIG. 24 is a cross-section view of the elements of FIG. 23 with a second layer of photoresist placed thereon.
Figure 25:
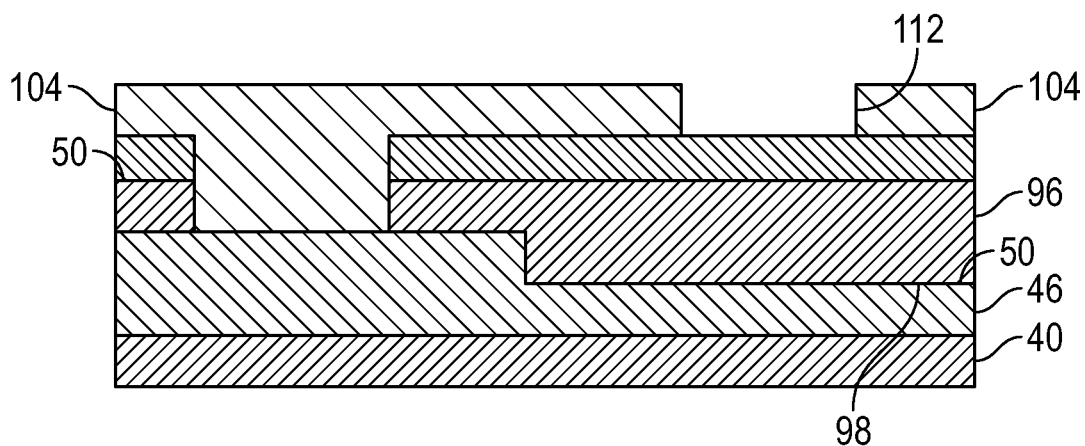
FIG. 25 is a cross-section view of the elements of FIG. 24 with a pattern formed in the second layer of photoresist.
Figure 26:
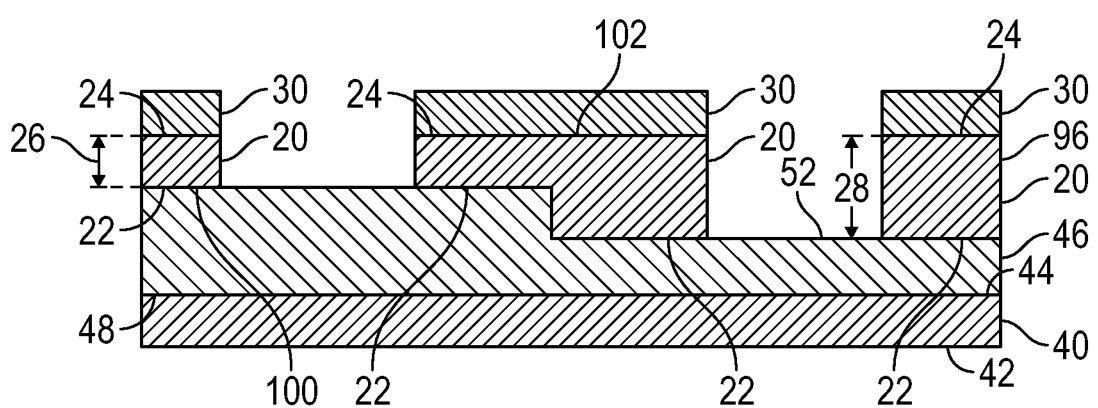
FIG. 26 is a cross-section view of the elements of FIG. 25 with the nickel and copper layers having been etched through at the pattern in the second layer of photoresist and the second layer of photoresist having been removed.

A second layer 110 of photoresist 104 is then added to the elements as shown in FIG. 24 and a pattern 112 is formed therein, as seen in FIG. 25. Again, there may be a plurality of spaces composed in the pattern 112. The nickel layer 30 and copper layer 96 are fully etched through at the pattern down to the ceramic layer 46 to form the traces 20, and the second layer 110 of photoresist 104 is removed. Some traces 20 have the first thickness 26 and some have the second thickness 28 and, if desired, the process may be used to form some traces 20 having both thicknesses, as illustrated in FIG. 26. As with other processes described above, there may be more than two trace thicknesses by making slight modifications to the process as described above with respect to the process for forming IMS 4 to shape the copper layer 96. A process for forming DBC substrate 56 may be similar in many respects to the process for forming DBC substrate 38 except that the nickel plating 30 is not included (and, accordingly, is not etched through).

Figure 27:
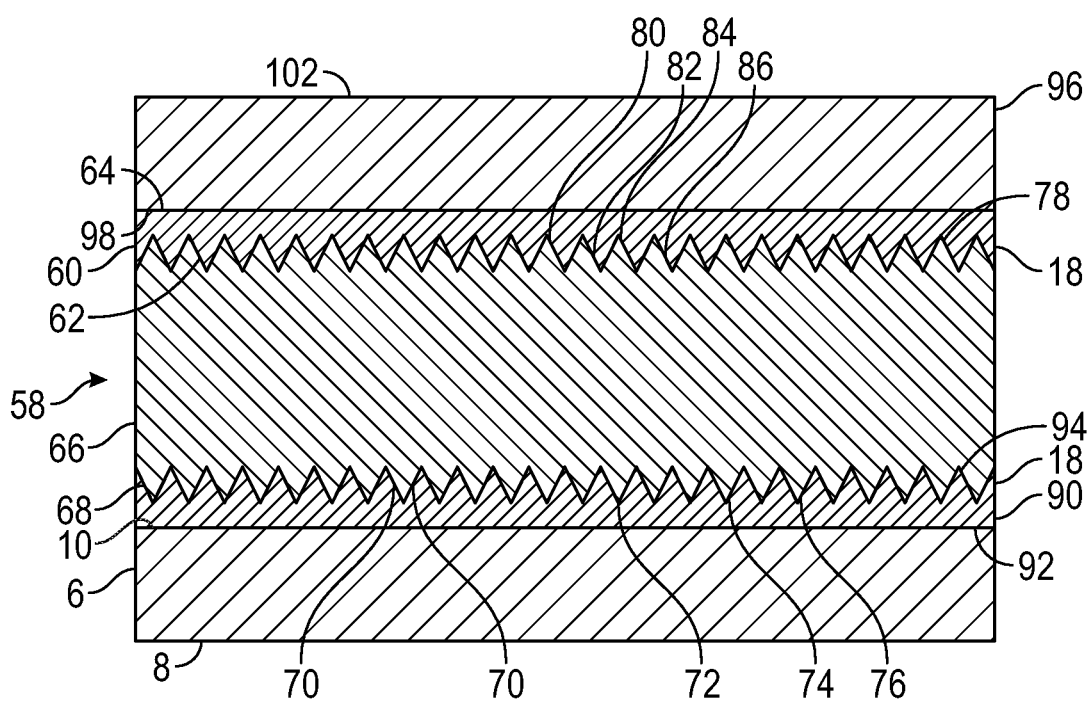
FIG. 27 is a cross-section close-up view a substrate implementation having a copper layer, a first dielectric layer, a ceramic layer, a second dielectric layer, and a metallic baseplate magnified.

FIG. 27 illustrates a power electronic substrate 58 that can be considered a hybrid as it has some elements similar to an IMS and some elements similar to a DBC substrate. A metallic baseplate 6 is used, having the first surface 8 and second surface 10 as previously described. There are two dielectric layers 60 and 90, and a ceramic layer 66 is sandwiched therebetween. The second dielectric layer 90 has a first surface 92, on an opposite side from a second surface 94, the first surface 92 being bonded to the second surface 10 of the metallic baseplate 6.

A first surface 68 of the ceramic layer 66 has a bonding pattern 70 thereon. This may include bonding ridges 72, conical projections 74, pyramidal projections 76, and the like dispersed on the first surface 68 of the ceramic layer. Other patterns and/or shapes may be employed to increase the surface area and/or the surface interaction between the ceramic layer 66 and the dielectric material. Referring to FIG. 27 (and the page on which the drawing is presented) the bonding pattern 70 may include a series of discrete elements that extend through the surface of the page (such as a grid or array of individual projections when viewed from above) and/or rows extending through the page surface. The second surface 94 of the second dielectric layer 90 receives the bonding pattern 70. This may be accomplished by the second dielectric layer 90 behaving as a fluid when it is being bonded to the ceramic layer 66 via a laminating or other pressure process inducing localized flow of the dielectric material to effectively form a pattern that is complementary, or substantially complementary, to the bonding pattern 70. The second dielectric layer 90 may be formed of an epoxy 18, and the bonding pattern 70 may assist the epoxy 18 to bond sufficiently to the ceramic layer 66.

A second surface 78 of the ceramic layer 66 opposite the first surface 68 also includes a bonding pattern 80, which may include any features or characteristics previously described with respect to bonding pattern 70, and may include bonding ridges 82, conical projections 84, pyramidal projections 86, and the like. Other patterns and/or shapes may be used. The first surface 62 of the first dielectric layer 60 receives the bonding pattern 80 and, accordingly, forms a complementary or substantially complementary pattern on the first surface 62. The first dielectric layer 60 may have any of the characteristics, features, and so forth of the second dielectric layer 90. A second surface 64 of the first dielectric layer 60, opposite the first surface 62, is bonded to a copper layer 96.

Figure 28:
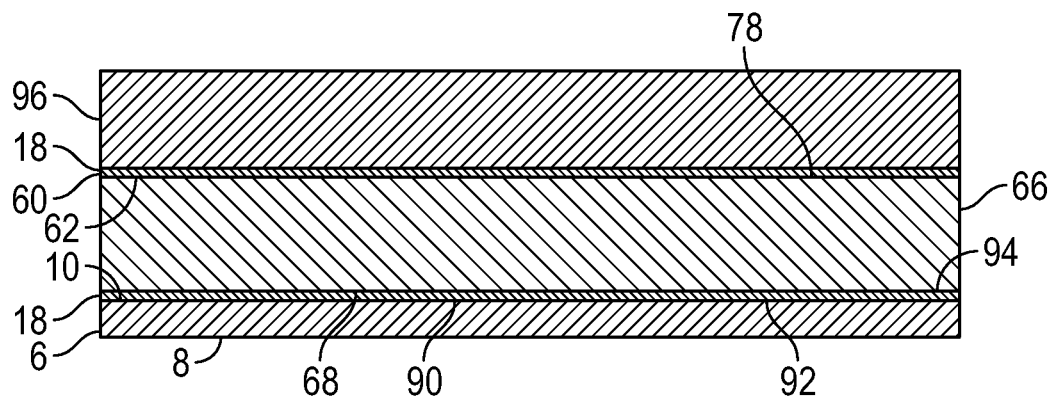
FIG. 28 is a cross-section view of the elements of FIG. 27 shown with less magnification.
Figure 29:
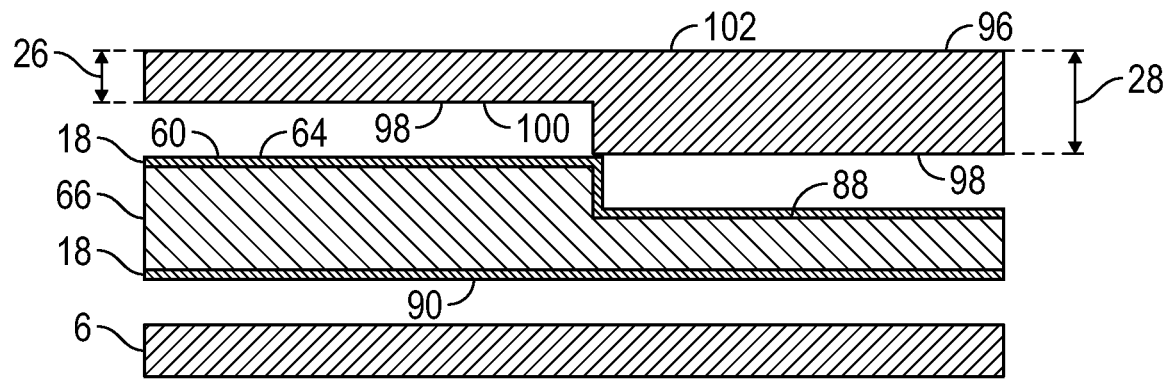
FIG. 29 is a cross-section view of the copper layer of FIG. 8 having a pattern thereon, a first dielectric layer, a ceramic layer having a pattern complementary to the copper layer, a second dielectric layer, and a metallic baseplate of a power electronic substrate prior to fully coupling the elements together.
Figure 30:
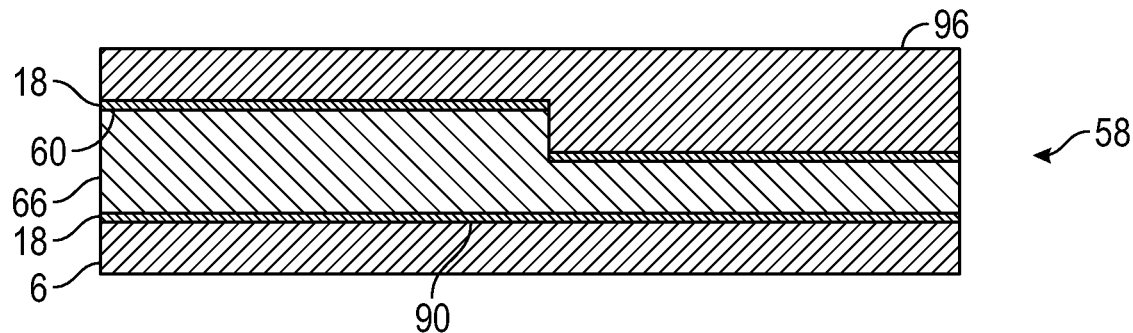
FIG. 30 is a cross-section view of the elements of FIG. 29 fully coupled together.

FIG. 28 is a view of the power electronic substrate 58 shown at a lesser degree of magnification so that the bonding patterns 70, 80 is not visible. Traces 20 may be formed in the copper layer 96 at this point, in a similar manner as described above with respect to other power electronic substrates. The power electronic substrate 58 may have a copper layer 96 (and accordingly, traces 20) of a uniform thickness, or the copper layer 96 may have a pattern 100 therein and the ceramic layer 66 may have a pattern 88 therein, as seen in FIGS. 29 and 30, that is complementary, or substantially complementary, to pattern 100 (and may be formed through etching processes as described herein) so that there will be traces 20 of varying thicknesses, which may be formed using techniques already described with respect to other power electronic substrates herein. In other implementations, however, the traces 20 may be formed without varying thicknesses.

In implementations of power electronic substrates disclosed herein which use an epoxy or resin for the dielectric layer, the dielectric layer may have a thickness from its first surface to its second surface of, or of about, 25 microns to, or to about, 300 microns. The epoxy or resin may include thermally conductive filler particles, such as by non-limiting example $SiO_2$, $Al_2O_3$, BN, or the like, dispersed therein. Copper layers described herein may be copper foil and may have, by non-limiting example, thicknesses ranging from, or from about, 18 microns to, or to about 200 microns, or greater. In implementations in which the metallic baseplates are formed of aluminum they may have an alumite and/or anodized aluminum layer on the first and second surfaces. Some metallic baseplates may have, by non-limiting example, a thickness from the first surface to the second surface of, or of about, 1.5 mm.

In implementations herein in which a ceramic layer is used the ceramic layer may include, by non-limiting example, alumina, aluminum nitride, and other high thermally conductive ceramic or composite materials. A copper layer may be directly bonded to a ceramic layer using a high-temperature oxidation process wherein the copper and ceramic are heated to a controlled temperature in a nitrogen atmosphere containing about 30 ppm of oxygen (or about 1.5% concentration of $O_2$ in atom percentage) to form a copper-oxygen eutectic which bonds both to the copper and to an oxide of the ceramic layer. In implementations the ceramic layer may be $Al_2O_3$ and a thin layer of copper-aluminum-spinel may bond the copper layer to the ceramic layer. In implementations the ceramic layer may be aluminum nitride and a thin layer of copper-aluminum-nitride may be formed by first oxidizing the surface of the aluminum nitride to form a layer of alumina by high temperature oxidation. In implementations a copper layer may be bonded to a ceramic layer using a sintering process. In particular implementations, the sintering process may involve melting or softening small particles comprised in each of the copper layer and the ceramic layer to bond them with adjacent small particles. By small in this process is meant microscopic particles.

The hybrid power electronic substrate 58 shown in FIGS. 27-30, due to the lack of a direct copper-to-ceramic bond, eliminates the need for the high temperature bonding processes described above. In addition, because there is no need for a high temperature bonding or other sintering process, the substrate 58 including a ceramic layer can be formed using laminating or other pressure bonding processes.

Implementations of IMS panels prior to singulation may have sizes of, or of about, 1 square meter, and may have the form of a square or of a rectangle. Implementations of DBC substrate panels prior to singulation may be wafer-shaped and may have sizes of, or of about, 5 inches by 7 inches.

Implementations of power electronic substrates disclosed herein may be used, by non-limiting example, as substrates for insulated gate bipolar transistor (IGBT) power modules, intelligent power modules (IPMs), power integrated modules (PIMs), power metal-oxide-semiconductor field-effect-transistors (MOSFETs), and the like. In implementations terminals of a semiconductor package may be formed of the copper layers described herein. Packages formed using the power electronic substrates disclosed herein may include top leads, side leads, down leads, glass to metal seals, surface mounts, liquid cooling, and the like.

PIM products may use DBC substrates with thicker copper trace thicknesses while IPM products may use IMS substrates with thinner copper trace thicknesses. Thinner copper traces are better for fine line space for routing while thicker copper traces are better for thermal and electrical performance for power electronic devices. In implementations the power electronic substrates disclosed herein may allow both of these advantages to be realized on a single substrate. In such implementations the thicker copper traces are used for power lines for power electronics while the thinner copper traces may be used for the rest of the circuitry with fine line spacing, and/or for fine pitch circuitry, such as for one or more drivers. The use of some thinner copper traces may reduce overall substrate stress.

In particular implementations a leadframe of a power electronic device may be bonded to the top layer (copper or nickel) of a power electronic substrate described herein. This may be done, in implementations, using a solder, such as by non-limiting example an Sn/Ag/Cu solder.

As may be envisioned, the process of forming an IMS shown in FIG. 17 may be followed up by additional steps to form a stacked IMS. By non-limiting example, a second dielectric layer may be laminated over the traces (and nickel plating, if present) and a second copper layer (having a pattern therein, or not) may then be coupled to the second dielectric layer, with traces later formed in the second copper layer to form the stacked IMS for a power electronic, these later traces having, if desired, multiple thicknesses as previously described with respect to other traces.

Implementations of substrates disclosed herein may utilize principles disclosed in U.S. Pat. No. 7,078,797 listing as inventors Suzuki et al., issued Jul. 18, 2006, titled "Hybrid Integrated Circuit Device," the disclosure of which is hereby entirely incorporated herein by reference. Furthermore, forming ground connections to substrates as illustrated in that reference, such as, by non-limited example shown in FIG. 1B of that reference, may be incorporated into power electronic substrate designs disclosed herein. Forming such connections may be accomplished, by non-limited example, by etching or otherwise forming a through-hole through the dielectric material, ceramic layer, or other insulative layer during processing, using methods disclosed herein, and then coupling an electrical contact on a surface of a die to a grounded metallic baseplate using a wirebond or the like.

Furthermore, substrate implementations like those disclosed herein by use the principles disclosed in U.S. Pat. No. 7,102,211, listing as inventors Ochiai et al., issued Sep. 5, 2006, titled "Semiconductor Device and Hybrid Integrated Circuit Device," the disclosure of which is hereby entirely incorporated herein by reference. Implementations of power electronic substrates disclosed herein may be used to form hybrid integrated circuit (HIC) devices such as those disclosed in that reference. The "fused leads" of an HIC package as shown in that reference, such as by non-limiting example those shown in FIG. 6B (elements 54, 55) of that reference, may be formed of the same copper layer that is used to make the traces 20 described herein.

Substrate implementations like those may be formed employing the principles disclosed in U.S. Pat. No. 7,521,290, listing as inventors Takakusaki et al., issued Apr. 21, 2009, titled "Method of Manufacturing Circuit Device," the disclosure of which is hereby entirely incorporated herein by reference. The methods disclosed therein of attaching a leadframe to multiple substrates (or in other words to a single panel containing multiple non-singulated substrates prior to singulation), to then be singulated, such as by non-limiting example the elements shown in FIG. 3A of that reference, may be incorporated in and/or used together with power electronic devices disclosed herein.

Implementations of substrates like those disclosed herein may be formed using the principles disclosed in U.S. Pat. No. 7,935,899, listing as inventors Takakusaki et al., issued May 3, 2011, titled "Circuit Device and Method of Manufacturing the same," the disclosure of which is hereby entirely incorporated herein by reference. Furthermore, packaging multiple HIC substrates within a single package as disclosed in that reference, such as that shown by non-limiting example in FIG. 1B and described in the specification of that reference, may be accomplished in part by forming several power electronic substrates according to methods disclosed herein in a single panel and then singulating each individual power electronic substrate, such as through punch or saw singulation, and interconnecting die and other components between HIC modules as shown in FIG. 1B of that reference.

In various implementations of substrates disclosed herein, the principles disclosed in U.S. Pat. No. 8,448,842, listing as inventor Wu, issued May 28, 2013, titled "Advanced copper bonding (ACB) with ceramic substrate technology," may be employed, the disclosure of which is hereby entirely incorporated herein by reference. Any of the bonding techniques disclosed therein with respect to bonding copper layers to ceramic layers may be utilized in forming power electronic substrates disclosed herein including, by non-limiting example: forming a copper film having a thickness of less than 1 micron on a ceramic substrate by sputtering deposition under 0.00133 torr and 150 degrees Celsius; plating a copper layer of 10-50 microns at room temperature, and; bonding a copper foil to the ceramic substrate by diffusion bonding under environments of high temperature, vacuum, and negative pressure inertia gas or $H_2$ partial pressure. In implementations a copper layer may be bonded to an aluminum oxide ceramic layer using methods described herein by heating in a sintering furnace up to 1000 degrees Celsius (or higher, such as about 1060 to about 1080 degrees Celsius) to form the eutectic layer described previously. In implementations no sputtering of copper onto a ceramic layer is needed to form the copper layer.

Implementations of substrates disclosed herein that include a nickel layer may employ the methods and principles disclosed in U.S. Pat. No. 7,936,569, listing as inventors Takakusaki et al., issued May 3, 2011, titled "Circuit Device and Method of Manufacturing the same," the disclosure of which is hereby entirely incorporated herein by reference. Furthermore, any of the elements therein describing nickel plating over copper traces, heat sink elements, and other elements used when attaching a die to a copper trace and/or electrically coupling an electrical contact on the die with one or more traces, such as by non-limiting example the elements shown in FIG. 1C of that reference and related description in the specification thereof, may be incorporated and/or used together with power electronic substrates disclosed herein. Additionally, insulating layers and/or dielectric layers described herein may include any of the elements, characteristics, features and the like of resins and/or insulating layers described in U.S. Pat. No. 7,936,569.

Implementations of substrates like those disclosed herein may employ the principles disclosed in Japan Patent Application Publication No. JP-2006-237561, listing as inventors Takakusaki et al., published Sep. 7, 2006, titled "Circuit Device and its Manufacturing Process," the disclosure of which is hereby entirely incorporated herein by reference. Furthermore, any of the elements therein that disclose nickel plating over copper traces, heat sink elements, and other elements used when attaching a die to a copper trace and/or electrically coupling an electrical contact on the die with one or more traces, such as by non-limiting example the elements shown in FIG. 1C of that reference and related description in the specification thereof, may be incorporated and/or used together with power electronic substrates disclosed herein. Additionally, insulating layers and/or dielectric layers described herein may include any of the elements, characteristics, features and the like of resins and/or insulating layers described in U.S. Pat. No. 7,936,569 previously incorporated by reference.

Implementations of substrates like those disclosed herein may be manufactured using the principles disclosed in Japan Patent Application Publication No. JP-2008-022033, listing as inventors Mizutani et al., published Jan. 31, 2008, titled "Hybrid Integrated Circuit Device," the disclosure of which is hereby entirely incorporated herein by reference. Furthermore, any of the v-score techniques applied to the substrates as disclosed therein in at least FIGS. 6-8 and 10, and related disclosure in the specification thereof, may be applied to and/or used with power electronic substrates disclosed herein to aid with singulation. In implementations such v-scores may be applied to the metallic baseplates described herein. In implementations double v-scores may be utilized wherein a plurality of v-scores are on an underside of the metallic baseplate and a corresponding plurality of v-scores are on the upper side of the metallic baseplate and aligned with the v-scores on the underside of the metallic baseplate to aid with singulation.

Figure 31:
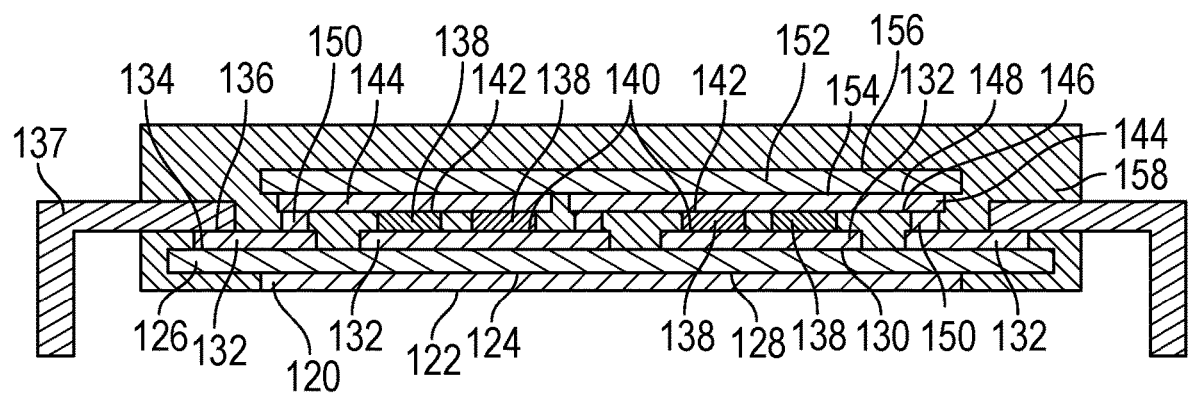
FIG. 31 is a cross-section view of an implementation of a wirebond-less interconnection semiconductor package.

Referring now to FIG. 31, a cross-section view of a wirebond-less (bond wire-less) interconnection semiconductor package is illustrated. The package may include a metallic baseplate 120. The baseplate includes a first surface 122 opposing a second surface 124. The metallic baseplate 120 may be, by non-limiting example, copper, tungsten, nickel, gold, palladium, or any other metal or combination of metals, including any disclosed in this document. The metallic baseplate may be patterned in various implementations, increasing thermal dissipation and/or permitting for electrical signal routing/power transfer. In various implementations, the patterning may be carried using any method disclosed herein. The metallic baseplate 120 may also be configured to couple to a heatsink in various implementations.

As illustrated, in various implementations, the package includes a first insulative layer 126. The first insulative layer may be a ceramic, laminate, or any other electrically insulative material disclosed in this document. The first insulative layer 126 includes a first surface 128 and a second surface 130 opposing the first surface. The first surface 128 may be coupled to the second surface 124 of the metallic baseplate.

The package may include a first plurality of metallic traces 132. The plurality of metallic traces may be include, by non-limiting example, copper, tungsten, nickel, gold, palladium, or any other metal or combination of metals, include any disclosed in this document. Each metallic trace has a first surface 134 and a second surface 136 opposing the first surface. Each first surface of each metallic trace of the first plurality of metallic traces may be coupled to a second surface 130 of the first insulative layer. The second surface of one or more of the metallic traces may be coupled to one or more leads.

The first plurality of metallic traces may vary in patterns and thickness. While FIG. 31 depicts that each metallic trace is of the same thickness, in various implementations the metallic traces of the first plurality of metallic traces 132 may vary in thickness with respect to each other in ways the same as or similar to the varying thickness traces disclosed in this document and in U.S. patent application Ser. No. 14/816,520 to Lin et al, entitled "Substrate Structures and Methods of Manufacture," now U.S. Pat. No. 9,397,017, issued Jul. 19, 2016, the disclosure of which is hereby incorporated herein entirely by reference. Likewise, the plurality of metallic traces may be formed using any of the methods disclosed in this document.

The package may include one or more semiconductor devices 138. The semiconductor devices 138 may be power semiconductor devices, such as, by non-limiting example, an IGBT, a diode, a MOSFET, a SiC device, a GaN device, or any other power semiconductor device. In various implementations, the semiconductor device may not a power semiconductor device but may be another component of the device, such as a capacitor, inductor, resistor, or other passive or active semiconductor component of the package. Each semiconductor device has a first surface 140 and an opposing second surface 142. The first surface 140 of each semiconductor device may be coupled to the second surface of the first plurality of metallic traces. In various implementations there may be multiple semiconductor devices directly coupled to a single metallic trace of the plurality of metallic traces, however, in other implementations there may be only a single semiconductor device coupled to a single metallic trace.

The package may include a second plurality of metallic traces 144 which may vary in pattern. The second plurality of metallic traces 144 may be, by non-limiting example, copper, tungsten, nickel, gold, palladium, or any other metal or combination of metals disclosed herein. As illustrated in FIG. 31, the second plurality of metallic traces may vary in thickness like those disclosed herein. Each metallic trace of the second plurality of metallic traces has a first surface 146 and a second opposing surface 148. At least one metallic trace of the second plurality of metallic traces may be coupled to the second surface of at least one semiconductor device. In various implementations, multiple metallic traces are coupled to multiple semiconductor devices and in other implementations, a single metallic trace is coupled to multiple semiconductor devices similarly to the first plurality of metallic traces.

As illustrated in FIG. 31, the second plurality of metallic traces may include thick portions 150. The thick portions 150 may couple to the first plurality of metallic traces while the thinner portions of the metallic traces may couple to the semiconductor devices. In this manner it is possible to have a semiconductor package that does not use any wire bonds or clips; rather the electrical/thermal interconnection is made possible through the varying thicknesses of the metallic traces themselves.

The package may include a second insulative material 152. The second insulative material includes a first surface 154 and a second surface 156. The first surface 154 may be coupled to the second surfaces 148 of the metallic traces of the second plurality of metallic traces 144. The second insulative material may be a ceramic material, a laminate material, or any other insulative material or any disclosed in this document.

The package may include an encapsulant used to protect and isolate the device, which may be any disclosed in this document.

Figure 32:
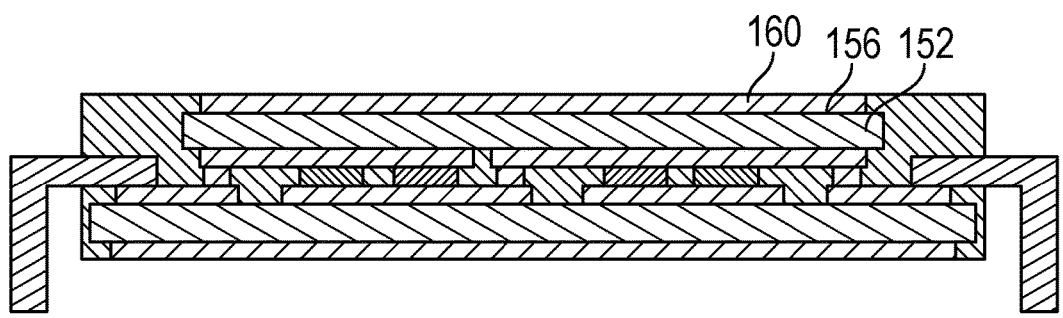
FIG. 32 is a cross-section view of an implementation of a dual cooling wirebondless interconnection semiconductor package.

Referring now to FIG. 32, a cross-section view of an implementation of a dual cooling wireless interconnection semiconductor package is illustrated. The package illustrated in FIG. 32 may have a similar structure as the package illustrated in FIG. 31 with the addition of a top metallic plate 160 coupled to the second surface 156 of the second insulative material 152. The top metallic plate 160 may serve as a second path of thermal dissipation and/or electrical connection to the package. Like the metallic baseplate, in various implementations the metallic top plate may be patterned to increase thermal dissipation and/or facilitate electrical connection. The metallic top plate 160 may be designed in various implementations to couple with to a heat sink. The metallic top plate 160 may be, by non-limiting example, copper, tungsten, nickel, gold, palladium, or any other metal or combination of metals including those disclosed in this document.

Figure 33:
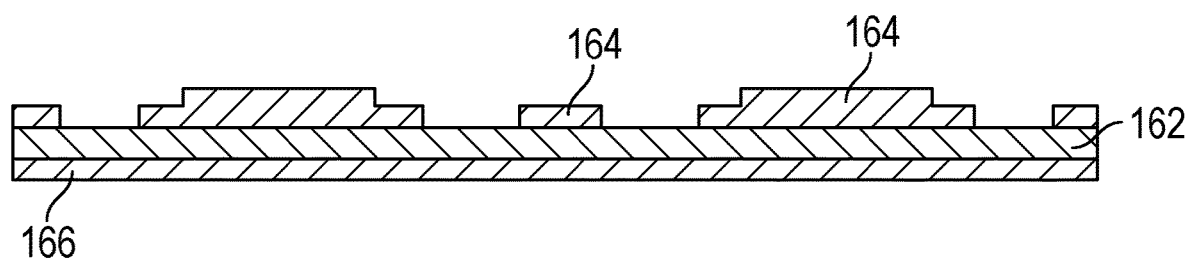
FIG. 33 is a cross-section view of a multiple thickness substrate structure with a metallic baseplate.

Referring now to FIG. 33, a cross-section view of a multiple thickness substrate structure with a metallic baseplate is illustrated. The structure includes an insulative layer 162. The insulative layer may be a ceramic, a laminate, or any other insulative layer like those disclosed in this document. The structure also includes a plurality of metallic traces 164 coupled to the insulative layer. The metallic traces may vary in pattern and thickness, as illustrated in FIG. 33. In various implementations, the metallic traces may be 200 or more microns thick, while in other implementations the thickness of the metallic traces may less than 200 microns. For those traces which are about 200 or more microns thick, the traces may be formed using a metal foil rather than through electro- or electroless plating techniques. The metallic traces may be, by non-limiting example, copper, tungsten, nickel, gold, palladium, or any other metal or combination of metals disclosed herein.

Figure 34:
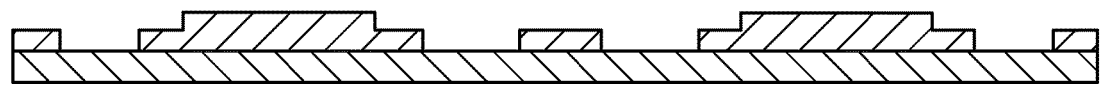
FIG. 34 is a cross-section view of the structure of FIG. 33 without a metallic plate.

The structure of FIG. 33 may include a metallic baseplate 166. The metallic baseplate may be patterned to form metallic traces similar to metallic traces 164. The metallic baseplate may be, by non-limiting example, copper, tungsten, nickel, gold, palladium, or any other metal or combination of metals disclosed herein. In other implementations, as illustrated by FIG. 34, the multiple thickness substrate structure may not include the metallic baseplate.

Referring now to FIGS. 35A-35I, a exemplary process flow for forming the multiple thickness substrate structure of FIG. 33 is illustrated. Referring specifically to FIG. 35A, an insulative layer 162 is coupled between a first metal layer 168 and a second metal layer 166. In various implementations, only a single metal layer is coupled to the insulative layer. In implementations where the insulative layer is a ceramic, the metal layers may be bonded to the ceramic at high temperatures (between 800-1000 degrees Celsius). This bonding process is in contrast with conventional sintering processes which are conventionally used to form DBC substrates. In implementations where the metal layer is copper, the copper may be a copper foil between about 200 to about 300 microns thick. In various implementations, the copper foil may be thicker or thinner than this range of values.

In implementations where the insulative layer 162 is a laminate, the metal layers 168 and 166 may be laminated to the laminate using a low temperature lamination process rather than the high temperature bonding process. This lamination process may be any disclosed herein.

Referring to FIG. 35B, a first photoresist layer 170 is applied to the first and second metal layers. In various implementations, the first photoresist layer may be applied using sputtering, screen printing, or spin coating. The photoresist layer may be patterned. In the implementations illustrated, only the portion of the first photoresist layer adjacent to the first metallic layer was patterned, however, in various implementations the portion of the first photoresist layer bordering the second metallic layer may also be patterned.

Referring to FIG. 35C, the first photoresist layer 170 is exposed and developed to create a patterned first photoresist layer.

Referring to FIG. 35D, additional metal 172 is deposited onto the first and second metallic layer through the exposed or developed regions of the first photoresist layer 170. In various implementations the metal may be deposited using electrolytic plating, while in other implementations the metal is deposited using an electroless process.

Referring to FIG. 35E, the first photoresist layer is removed.

Referring to FIG. 35F, a second photoresist layer may be applied to the first and second metal layers along as well as the additional metal 172.

Referring to FIG. 35G, the second photoresist layer may be exposed or developed.

Referring to FIG. 35H, the first and second metallic layers may be etched and/or patterned in a manner corresponding to the exposed or developed photoresist layer.

Referring to FIG. 35I, the second photoresist layer may be removed, resulting in the structure illustrated in FIG. 33. This multiple thickness substrates having traces and/or other structures with differing thicknesses may be utilized in forming the wireless interconnect semiconductor packages illustrated in FIGS. 31 and 32.

Figure 36A:
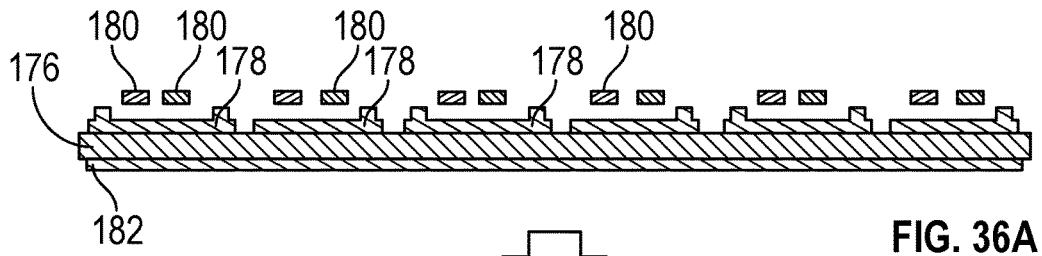
FIGS. 36A-36G are views of a process flow for forming the semiconductor package of FIG. 32.

Referring now to FIGS. 36A-36G, a process flow for forming the semiconductor package of FIG. 32 is illustrated. Referring specifically to FIG. 36A, a second insulative layer 176 may be coupled to a second plurality of metallic traces 178. The second plurality of metallic traces may be of varying thicknesses and shapes. As illustrated, a metallic top plate 182 may be coupled to the insulative layer 176.

Figure 36B:
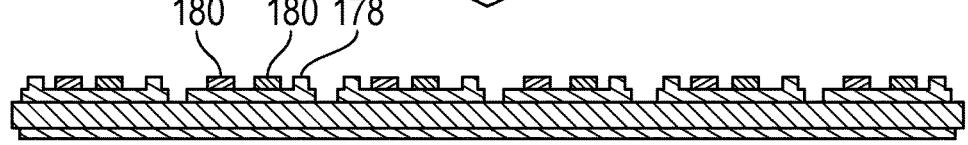

Semiconductor devices 180 may be coupled to the second plurality of metallic traces as illustrated in FIG. 36B. These semiconductor devices may be any disclosed in this document. Semiconductor traces 180 may be coupled to the second plurality of metallic traces using high temperature soldering or Ag sintering.

Figure 36C:
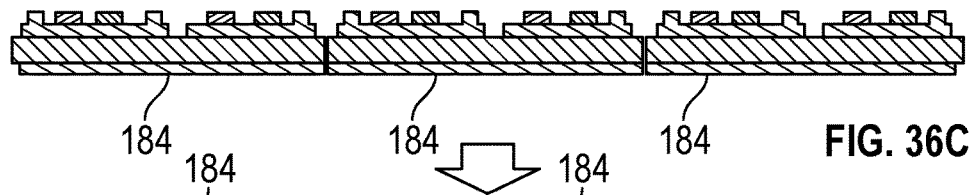

Referring to FIG. 36C, the structure illustrated in FIG. 36B may be separated into separate substrate structures through a singulation process which may involve sawing, water jet cutting, laser cutting, or any other process for separating the substrate material.

Figure 36D:
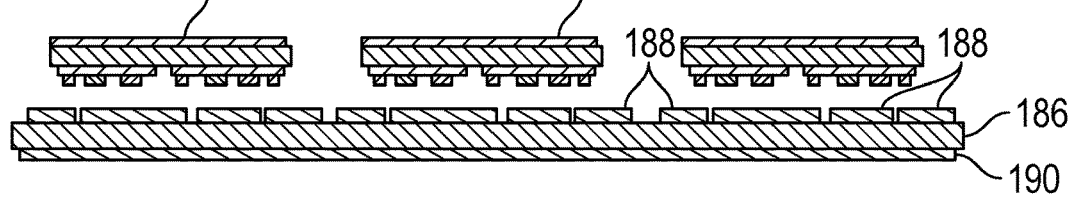

The substrate structures 184 may then be flipped/rotated 180 degrees as illustrated in FIG. 36D. FIG. 36D also illustrates a first insulative layer 186 that may be coupled to a metallic baseplate 190 and a first plurality of metallic traces 188.

Figure 36E:
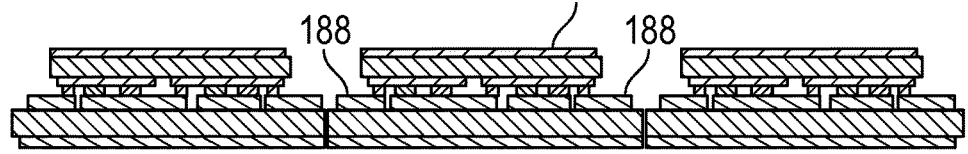

Referring to FIG. 36E, the substrate structures 184 may be coupled to the first plurality of metallic traces in a way that the semiconductor devices are between the first plurality of metallic traces and the second plurality of metallic traces and the first plurality of metallic traces is connected to the second plurality of metallic traces. The second insulative layer may then be separated forming singulated semiconductor packages.

Figure 36F:
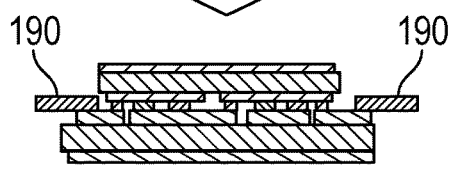

Referring to FIG. 36F, leads 190 may be coupled to metallic traces within the first plurality of metallic traces.

Figure 36G:
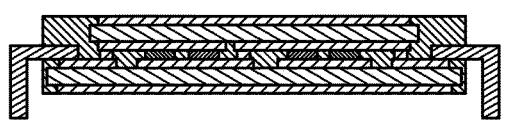

Referring to FIG. 36G, an encapsulant may be applied to the package to isolate and protect the package. The encapsulant may be applied using compression molding, transmolding, or glob-top techniques. In various implementations, the encapsulant may be applied using other techniques including map molding or injection molding.

Figure 37:
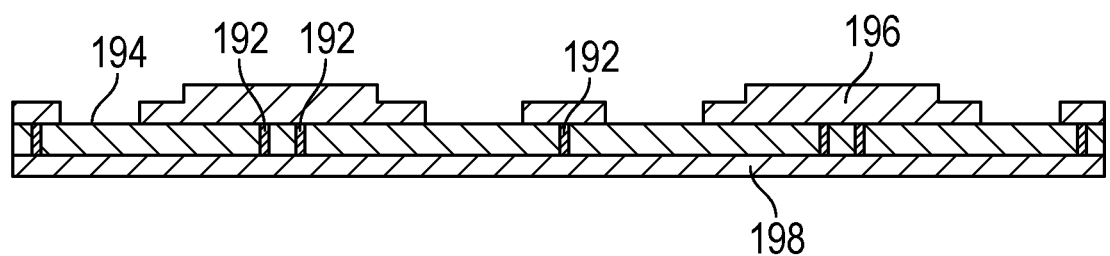
FIG. 37 is a cross-section view of a multiple thickness substrate structure with openings therethrough with a metallic baseplate.
Figure 38:
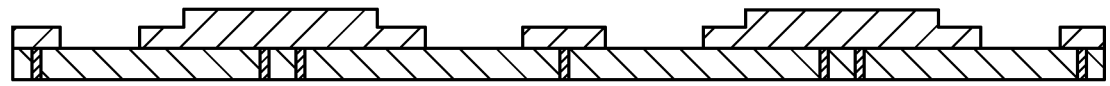
FIG. 38 is a cross-section view of the structure of FIG. 37 without a metallic plate.

Referring to FIG. 37, a cross section view of a multiple thickness substrate structure with openings therethrough is illustrated. The structure of FIG. 37 is the same as the structure of FIG. 33 disclosed herein except that there are openings 192 through the insulative layer 194. In various implementations the openings may be plated through holes or vias, while in other implementations the openings may be other types of openings, including those where the opening is not completely filled with a material, whether electrically and/or a thermally conductive material. The openings in the insulative layer may allow the metallic traces 196 to electrically and/or thermally communicate with the metallic base plate 198. In various implementations, the substrate structure may not include a metallic baseplate, as illustrated in the structure of FIG. 38.

Figure 39:
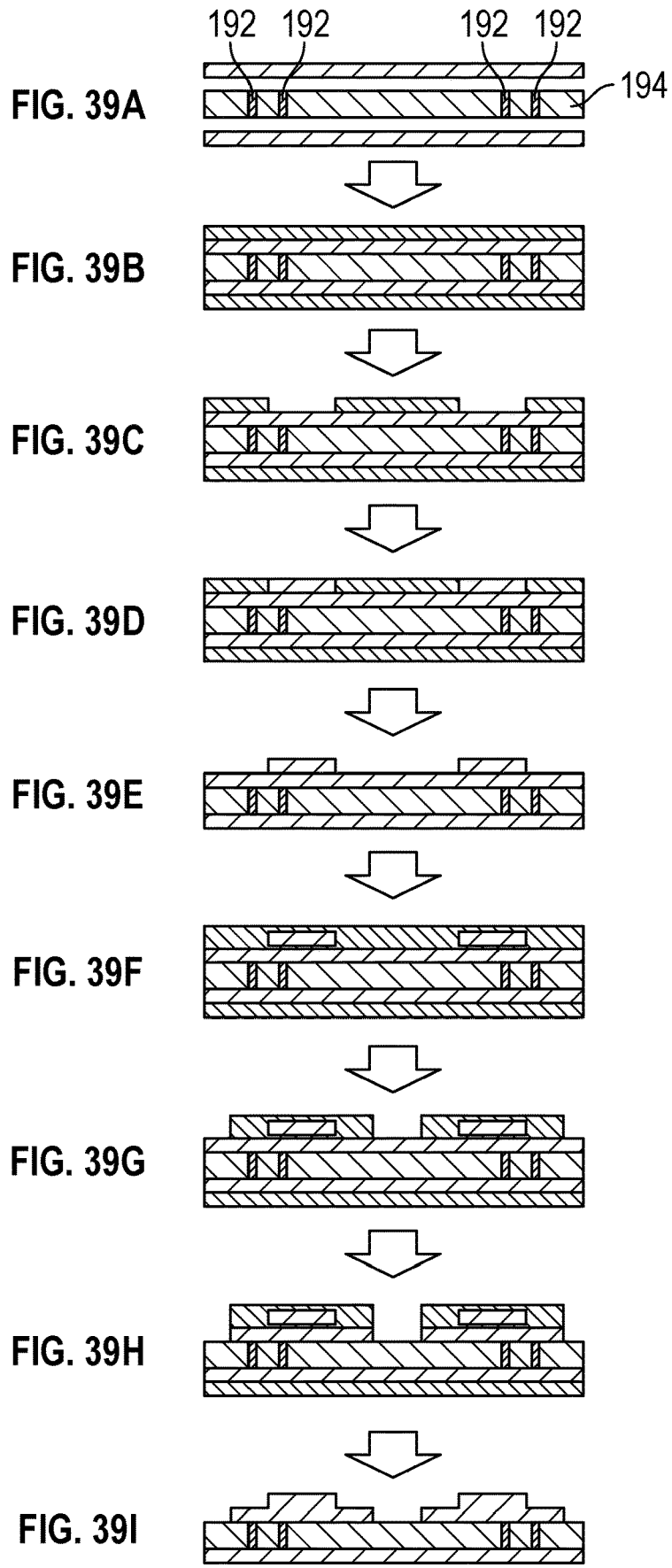
FIGS. 39A-39I are views of a process flow for forming a multiple thickness substrate structure with openings therethrough.

Referring now to FIGS. 39A-39I, a view of a process flow for forming the substrate structure of FIG. 37 is illustrated. Referring specifically to FIG. 39A, openings 192 are formed in the insulative layer 194. The openings may be formed using a laser drilling procedure, however, in other implementations the openings are formed using other techniques, including punching, etching, and any other method of forming an opening in the insulative material. The openings 192 may then be filled to form plated through holes, vias, or any other electrically/thermally conductive channel. The remainder of the process for forming the substrate structure of FIG. 37 as illustrated by FIGS. 39A-39I may be the same or similar to the process disclosed in FIGS. 35A-35I used to form the substrate structure of FIG. 33 as previously disclosed herein, with the main difference being that the insulative layer has openings therethrough. In various implementations additional steps and/or intermediate processing structures used to protect the material of the openings 192 may need to be used during the process illustrated by FIGS. 39A-39I. For example, additional photoresist patterning may be used to ensure that the openings are shielded from etching/metal deposition steps to prevent undesired metal removal or addition over the openings.

Figure 40:
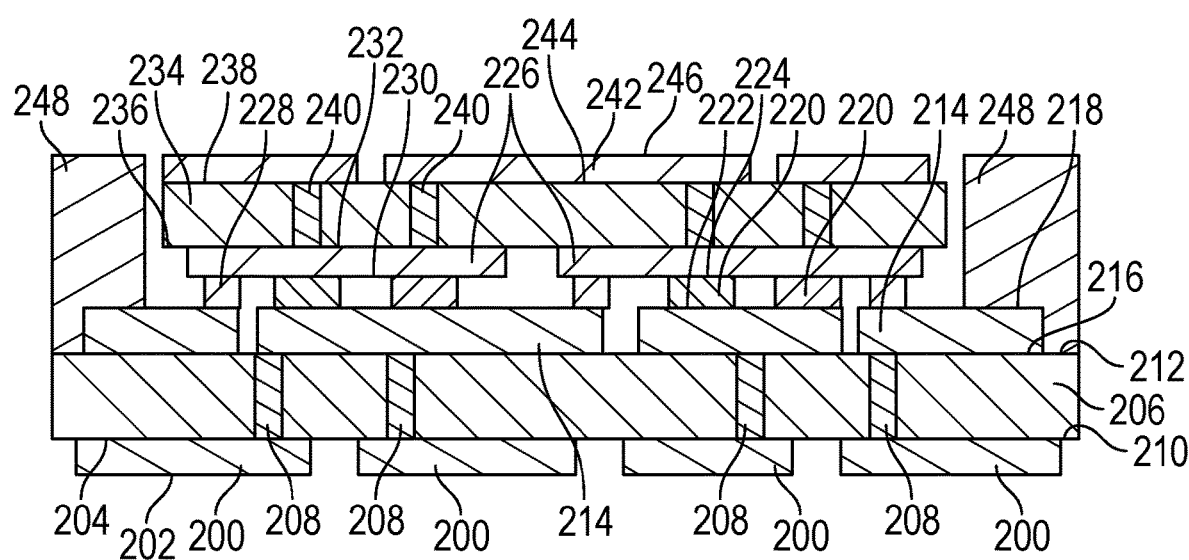
FIG. 40 is a cross-section view of a wirebond-less interconnection semiconductor package with openings through the insulative layers.

Referring now to FIG. 40, a wire bond-less (bond wireless) interconnection semiconductor package with openings through the insulative layers is illustrated. The semiconductor package may include a third plurality of metallic traces 200, each metallic trace in the third plurality of metallic traces including a first surface 202 and an opposing second surface 204. The third plurality of metallic traces 200 may be, by non-limiting example, copper, tungsten, nickel, gold, palladium, or any other metal or combination of metals disclosed in this document. The third plurality of metal traces may be formed into any variety of patterns and may be patterned using any method disclosed herein.

The semiconductor package may include a first insulative layer 206. The first insulative layer may have a first surface 210 and a second opposing surface 212 with the first surface 210 coupled to the second surface 204 of the third plurality of metallic traces. The first insulative layer may be a ceramic, a laminate, or any other insulative layer disclosed in this document. The insulative layer may include openings 208 therethrough. The openings may be, by non-limiting example, plated through holes, vias, or any other thermally/electrically conductive channel like those disclosed herein. The openings may allow for additional heat transfer and/or electrical communication through the first insulated layer 206.

The semiconductor package may include a first plurality of metallic traces 214. Each metallic trace of the first plurality of metallic traces has a first surface 216 and a second surface 218 opposing the first surface. Each first surface of each metallic trace of the first plurality of metallic traces may be coupled to a second surface 212 of the first insulative layer. The first plurality of metallic traces 214 may be, by non-limiting example, copper, tungsten, nickel, gold, palladium, or any other metal or combination of metals disclosed in this document. The first plurality of metal traces may be a variety of patterns and thicknesses and may be patterned using any method disclosed herein.

The first plurality of metallic traces may be electrically coupled to the third plurality of metallic traces through the openings 208 through the first insulative layer. By electrically communicating with the third plurality of metallic traces 200, there is no need to have the first plurality of metallic traces 214 couple directly to a pair of leads as would normally be done if there were no openings through the first insulative layer.

The semiconductor package may include one or more semiconductor devices 220. The semiconductor devices 220 may be power semiconductor devices, such as, by non-limiting example, an IGBT, a diode, a MOSFET, a SiC device, a GaN device, or any other power semiconductor device. In various implementations, the semiconductor device is not a power semiconductor device but may be any other passive or active component or device disclosed in this document. Each semiconductor device has a first surface 222 and an opposing second surface 224. The first surface 222 of each semiconductor device may be coupled to the second surface 218 of one or more metallic traces of the first plurality of metallic traces. In various implementations there are multiple semiconductor devices directly coupled to a single metallic trace, however, in other implementations there is only a single semiconductor device coupled to a single metallic trace similar to the other implementations disclosed herein.

The package may include a second plurality of metallic traces 226 which may vary in pattern. The second plurality of metallic traces 226 may be, by non-limiting example, copper, tungsten, nickel, gold, palladium, or any other metal or combination of metals disclosed in this document. As illustrated in FIG. 40, the second plurality of metallic traces 220 may vary in thickness like those disclosed in this document. Each metallic trace of the second plurality of metallic traces has a first surface 230 and a second opposing surface, 232. At least one metallic trace of the second plurality of metallic traces may be coupled to the second surface of at least one semiconductor device. In various implementations, multiple metallic traces are coupled to multiple semiconductor devices and in other implementations, a single metallic trace is coupled to multiple semiconductor devices.

As illustrated in FIG. 40, the second plurality of metallic traces may include thick portions 228. The thick portions 228 may couple to the first plurality of metallic traces 214 while the thinner portions of the metallic traces may couple to the semiconductor devices. In this manner, it is possible to have a semiconductor package that does not use any wire bonding or clips; rather the interconnection is made possible through the varying thicknesses of the metallic traces.

The semiconductor package may include a second insulative layer 234. The second insulative layer may have a first surface 236 and a second opposing surface 238 with the first surface 236 coupled to the second surface 232 of the second plurality of metallic traces. The second insulative layer may be a ceramic, a laminate, or any other insulative layer disclosed herein. The second insulative layer may include openings 240 therethrough. The openings may be, by non-limiting example, plated through holes, vias, or any other thermally/electrically conductive channel disclosed herein. The openings may allow for additional heat transfer and electrical communication through the second insulated layer 234.

The semiconductor package may include a fourth plurality of metallic traces 242 with each metallic trace in the fourth plurality of metallic traces including a first surface 244 and an opposing second surface 246. The fourth plurality of metallic traces may serve as an additional path for thermal dissipation and/or electrical communication. The fourth plurality of metallic traces 242 may be, by non-limiting example, copper, tungsten, nickel, gold, palladium, or any other metal or combination of metals disclosed in this document. The fourth plurality of metallic traces may be a variety of patterns and may be patterned using any method disclosed herein.

The fourth plurality of metallic traces may be electrically coupled to the second plurality of metallic traces 226 through the openings 240 through the second insulative layer 234. The openings through the second insulative layer may also allow for greater thermal dissipation and/or electrical connection.

The package may include an encapsulant 248 to isolate and protect the device which may be any encapsulant disclosed herein and which may be applied using any encapsulating/molding process disclosed herein.

Referring now to FIGS. 41A-41F, a process flow for forming the semiconductor package of FIG. 40 is illustrated. The process illustrated by FIGS. 41A-41D is the same as the process for forming the semiconductor package of FIG. 32 illustrated in FIGS. 36A-36D and previously disclosed herein, with the exception that the process used to form the package of FIG. 40 includes openings through the insulative layers and rather than having the top plate and baseplate referred to in FIGS. 36A-36D, the process for forming the package of FIG. 40 includes a fourth plurality of metallic traces and a third plurality of metallic traces in place of the top plate and baseplate. Additional intermediate process steps and/or structures may be employed to protect the structures of the openings like any of those previously described in this document.

Figure 41A:
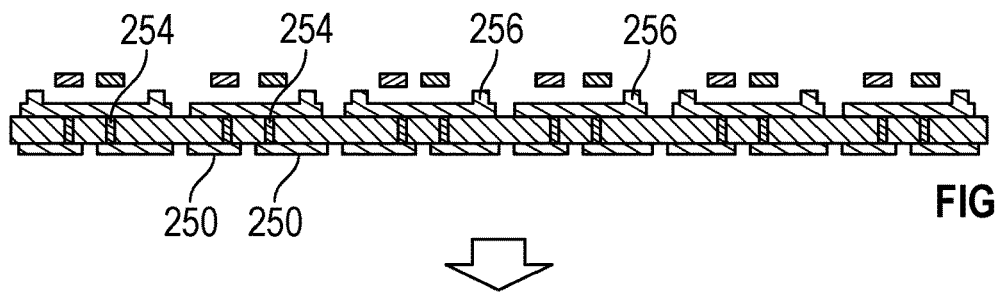
FIGS. 41A-41F are views of a process flow for forming the semiconductor package of FIG. 40.
Figure 41B:
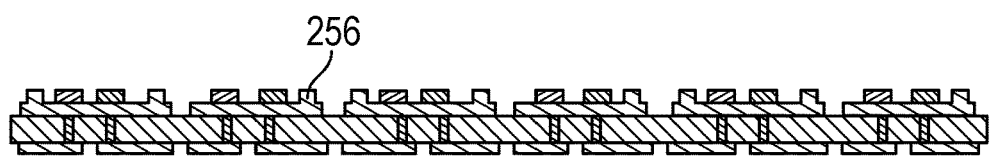
Figure 41C:
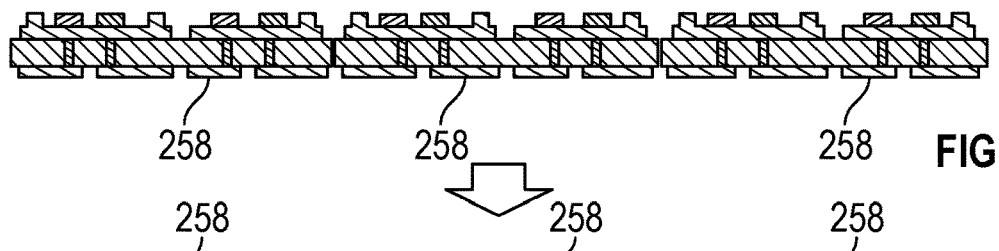
Figure 41D:
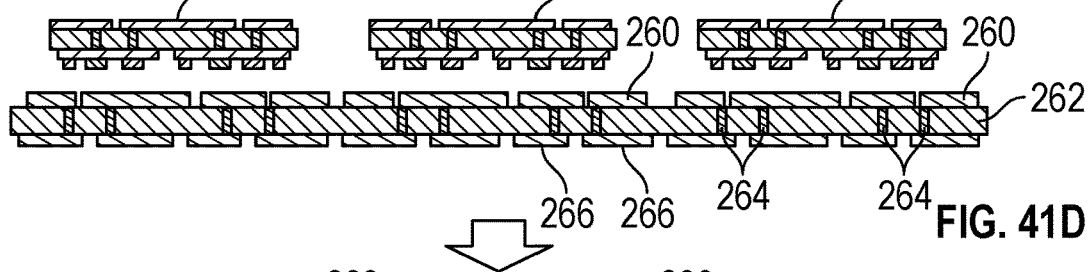
Figure 41E:
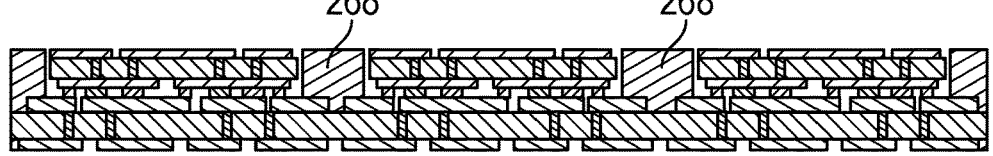

The process differs as illustrated by FIG. 41E. The substrate structures 258 of FIG. 41D may be coupled to the first plurality of metallic traces 260 in a way that the semiconductor devices are between the first plurality of metallic traces and the second plurality of metallic traces and the first plurality of metallic traces is connected to the second plurality of metallic traces. This is done through the varying thickness of the first plurality of traces.

An encapsulant 268 may be applied to the package to isolate and protect the package. In various implementations the encapsulant may be applied using compression molding, however, in other implementations the encapsulant may be applied using other techniques such as trans-molding or glob-top techniques or other techniques disclosed in this document.

Figure 41F:
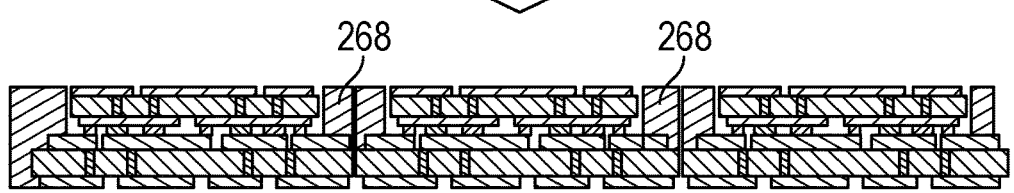

Referring to FIG. 41F, the semiconductor packages may be singulated in between the substrate structures 258 and through the encapsulant 268, resulting in the package disclosed in FIG. 40. This process may allow for the production of a smaller semiconductor package as it is not only wire bond-less, but there is also no need for leads to connect to the sides of the package as it can electrically communicate with third plurality of metallic traces 266.

Figure 42:
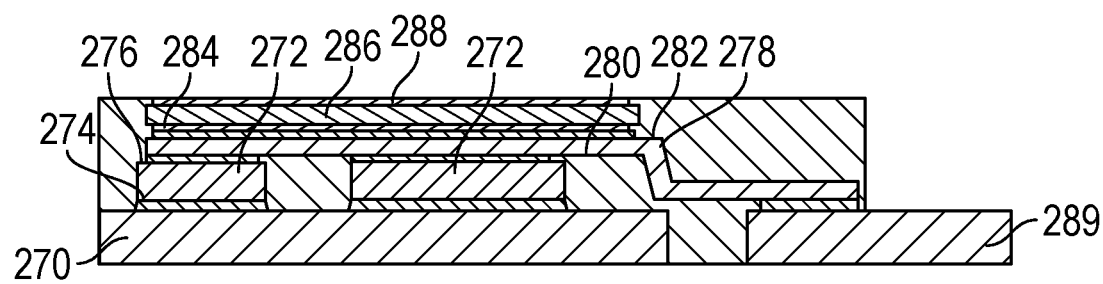
FIG. 42 is a cross-section view of a dual cooling semiconductor package with a clip.

Referring to FIG. 42, a cross-section view of a dual cooling semiconductor package with a clip is illustrated. The package may include a lead frame 270 in various implementations, or a lead frame may not be included and a substrate like any of those disclosed herein may be used. The lead frame 270 may serve as a first path of thermal dissipation. The lead frame may be coupled to one or more semiconductor devices 272 which may be any of those disclosed herein. The lead frame 270 may be coupled to the semiconductor devices 272 through soldering, Ag sintering, conductive epoxy, or other techniques including any disclosed herein.

The semiconductor devices have a first surface 274 and a second opposing surface 276. The semiconductor devices may be any type of semiconductor device, including the devices disclosed herein. The package may include a clip 278 coupled to the second surface 276 of the semiconductor devices. The clip 278 has a first surface 280 and a second opposing surface 282. The clip may be coupled to, and electrically communicate to, one or more leads 289. In various implementations, however, the clip may not couple with one or more leads, but may serve to only electrically/thermally connect the semiconductor device(s) together.

In various implementations, the package may include a metallic layer 284 with a first and second surface, the first surface coupled to the second surface of the clip 284. The metallic layer may be coupled to the clip using soldering, Ag sintering, conductive epoxy, or any other coupling technique disclosed herein. The metallic layer may be, by non-limiting example, copper, tungsten, nickel, gold, palladium, or any other metal or combination of metals disclosed herein. In various implementations, the metallic layer may be patterned and coupled to a motherboard and/or heatsink.

The package may include an insulative layer 286 with a first surface coupled to the second surface of the metallic layer 284. In various implementations the insulative layer may be a ceramic, $Al_2O_3$, SiN, AlN with copper, AlN without copper, or any other insulative material disclosed in this document.

In various implementations the package may include a top metal plate 288 coupled to the second surface opposing the first surface of the insulative layer 286. While this is may not present in all implementations, when it is included, it may provide a second path for thermal dissipation and/or electrical connection. The top metal plate may be, by non-limiting example, copper, tungsten, nickel, gold, palladium, or any other metal or combination of metals disclosed in this document. The top metal plate 288 may be patterned, and in various implementations the top metal plate may be coupled to a heat sink.

Figure 43:
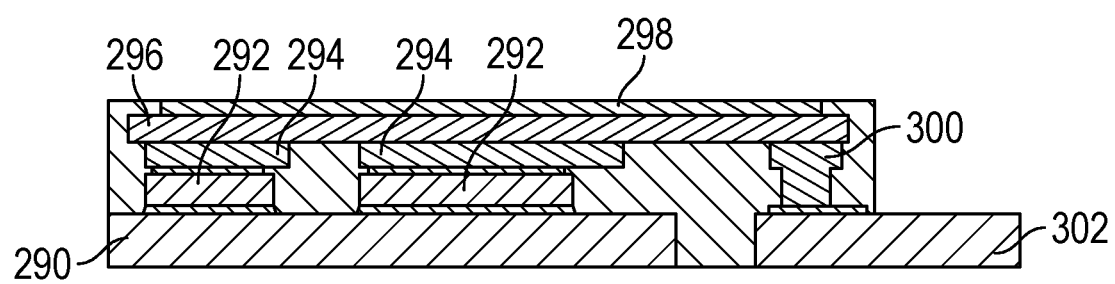
FIG. 43 is a cross-section view of an implementation of a semiconductor package without a clip.

Referring now to FIG. 43, a cross-section view of a dual sided cooling semiconductor package without a clip is illustrated. The package may include a lead frame coupled to semiconductor devices as previously disclosed in regards to FIG. 42 (or may include any substrate type disclosed in this document instead). The package may also include a plurality of metallic traces 294 with one or more of the metallic traces of the first plurality of metallic traces coupled to the semiconductor devices 292. The metallic traces may vary in size and thickness like any of those disclosed in this document. For example, in the implementation illustrated by FIG. 43, metallic trace 300 is thicker than the other metallic traces and rather than coupling to a semiconductor device, it couples to a lead. As can be seen, it is the thicker metallic trace 300 that is used to couple to the leadframe structure while the thinner plurality of metallic traces 294 of the metal layer couple with the semiconductor devices.

The package may include an insulative layer 296 that couples to the plurality of metallic traces. In various implementations, the insulative layer may be any type of insulative layer disclosed herein. The thick metallic trace 300 may offer support and a further means of heat dissipation and/or electrical connection for the insulative layer 296. In various implementations, there may be a conductive path/opening through the insulative layer 296 that allows for the semiconductor devices to electrically and/or thermally communicate with the lead through the plurality of metallic traces and the insulative layer 296. This opening may have the structure of any of the openings disclosed in this document.

The package may include a metallic layer 298 coupled to the insulative layer. The metallic layer may be, by non-limiting example, copper, tungsten, nickel, gold, palladium, or any other metal or combination of metals disclosed in this document. The metallic layer 298 may serve as an additional path for thermal dissipation and/or electrical connection.

Figure 44:
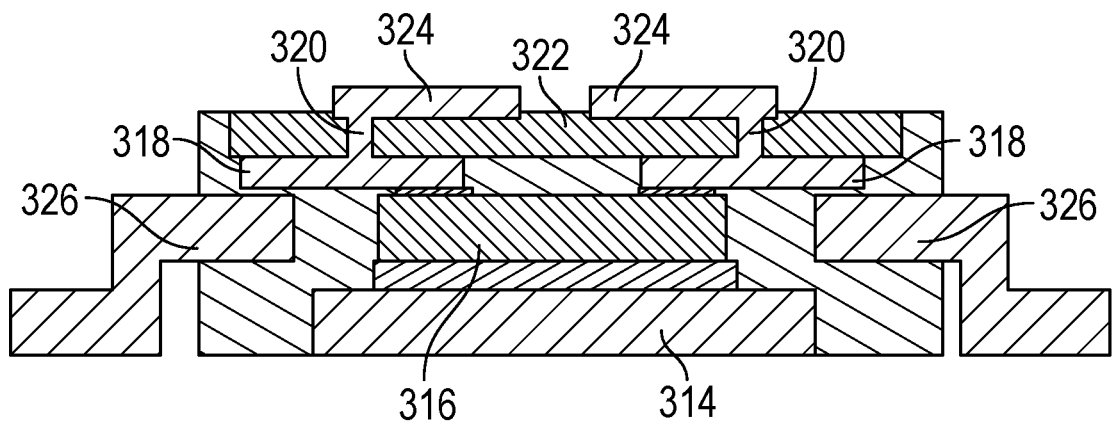
FIG. 44 is a cross-section view of a wirebond-less interconnection semiconductor package with openings through the insulative layer of the semiconductor package.

Referring to FIG. 44, a cross-section view of a wirebond-less interconnection semiconductor package with openings through the insulative layer of the semiconductor package is illustrated. The semiconductor package structure is similar to the package shown in FIG. 40 with the main difference being that the bottom carrier is a lead frame rather than an insulative layer/substrate like those disclosed in this document. Specifically, the package of FIG. 44 may include a lead frame 314. The lead frame may be coupled to a die 316 as disclosed in this document.

The package may include a first plurality of metallic traces 318. The first plurality of metallic traces may be patterned and formed according to any method previously disclosed herein, and may be made of any material previously disclosed herein. The first plurality of metallic traces may have a first side opposing a second side. The first side of the first plurality of metallic traces may be coupled to the die 316. The first side of one or more die within the first plurality of die may also be coupled to lead frame feet 326.

The semiconductor package illustrated includes a first insulative layer. The second side of the first plurality of metallic traces may be coupled to a first insulative layer 322. The first insulative layer 322 may include openings 320 therethrough. In various implementations, the openings may be, by non-limiting example, plated through holes, vias, or any other conductive opening.

The package may also include a second plurality of metallic traces 324. The second plurality of metallic traces may be patterned according to any method previously disclosed herein, and may also be made of any material previously disclosed herein. The second plurality of metallic traces may be coupled to the side of the insulative layer opposite the side of the insulative layer that is coupled with the first plurality of metallic traces.

The openings 320 through the insulative layer 322 may be positioned to be between the first plurality of metallic traces and the second plurality of metallic traces. In such implementations, the openings provide an electrically conductive channel and the die 316 is electrically coupled with the second plurality of metallic traces, 324.

The semiconductor package may be encapsulated in an encapsulant using any method and encapsulant previously disclosed herein.

Figure 45:
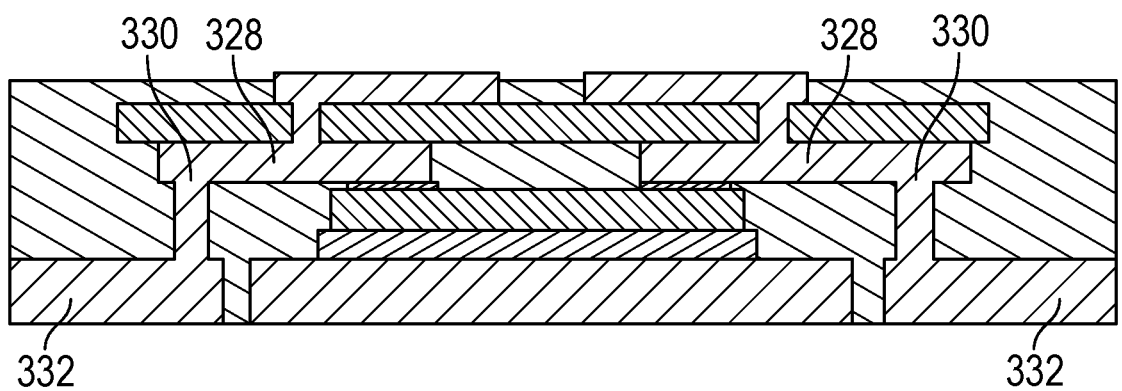
FIG. 45 is a cross-section view of an alternative wirebond-less interconnection semiconductor package with openings through the insulative layer of the semiconductor package

Referring to FIG. 45, a cross-section view of an alternative wirebond-less interconnection semiconductor package with openings through the insulative layer of the semiconductor package is illustrated. This implementation is similar to the implementation of FIG. 44 as previously disclosed herein with the main difference being that the first plurality of metallic traces 328 may vary in thickness. The multiple thickness metallic traces may be patterned and formed according to any method previously disclosed herein for forming such traces. The thick portions 330 of the metallic traces of the first plurality of metallic traces 328 are coupled to the lead frame while the thinner portions of the first plurality of metallic traces 328 are coupled to the semiconductor devices. In implementations where multiple thickness metallic traces are used, the thick portions of the metallic traces may couple with the lead frame 332.

Figure 46:
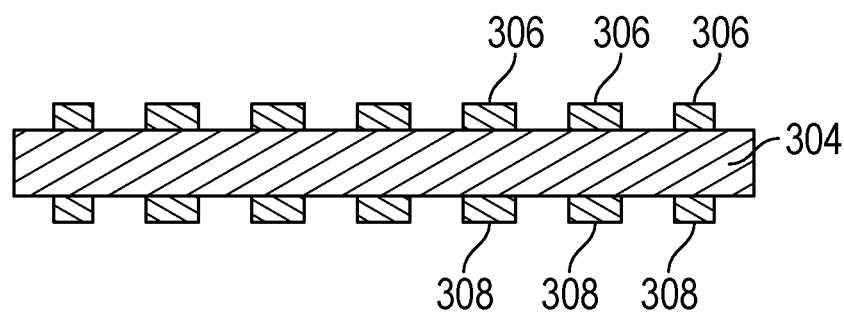
FIG. 46 is a cross-section view of an insulative layer with patterned metal plates coupled thereto.

Referring now to FIG. 46, a cross section view of an insulative layer 304 with patterned metal plates 306, 308 coupled thereto is illustrated. In various implementations, rather than using a flat metal plate for thermal dissipation as disclosed in FIGS. 42-43, one or both metal plates may be patterned. The patterned metal plates may increase thermal dissipation and/or allow for electrical connection with the plates.

Figure 47:
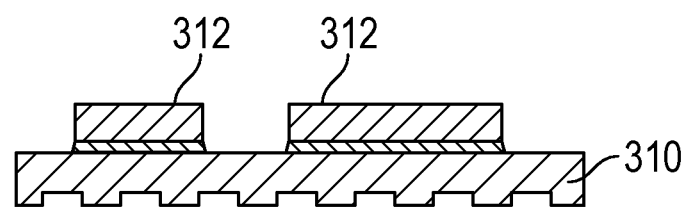
FIG. 47 is a cross section view of semiconductor devices coupled to a patterned lead frame.

Similarly, referring to FIG. 47, a patterned lead frame 310 is coupled to semiconductor devices 312. In various implementations, the packages illustrated in FIGS. 42, 43, 44 and 45 may include a patterned lead frame 310 to increase thermal dissipation and/or electrical connection in various implementations.

In places where the description above refers to particular implementations of substrate structures, trace structures, opening structures, clip structures, and methods of manufacture and implementing components, sub-components, methods and sub-methods, it should be readily apparent that a number of modifications may be made without departing from the spirit thereof and that these implementations, implementing components, sub-components, methods and sub-methods may be applied to other substrate structures, trace structures, opening structures, clip structures, and methods of manufacture.

What is claimed is:

1. A semiconductor package, comprising:
   a metallic baseplate comprising a first surface and a second surface opposing the first surface;
   an electrically insulative layer comprising a first surface coupled to the second surface of the metallic baseplate, the electrically insulative layer having a second surface opposing the first surface of the electrically insulative layer;
   a first plurality of metallic traces, each metallic trace of the first plurality of metallic traces coupled to the second surface of the electrically insulative layer at a first surface of the metallic trace, each metallic trace of the first plurality of metallic traces having a second surface opposing the first surface of the metallic trace;

one or more semiconductor devices comprising a first surface and a second surface opposing the first surface, wherein the first surface of the one or more semiconductor devices are coupled to the second surface of each one of the first plurality of metallic traces;

a second plurality of metallic traces comprising a first surface and a second surface, wherein the first surface of at least one metallic trace of the second plurality of metallic traces is coupled to the second surface of the one or more semiconductor devices;

a second insulative layer comprising a first surface coupled to the second surfaces of the metallic traces of the upper plurality of metallic traces; and a mold compound encapsulating the one or more semiconductor devices;

wherein the the semiconductor package is configured to electrically couple to an external device through external connectors directly coupled to the first plurality of metallic traces and not to the second plurality of metallic traces.

2. The package of claim 1, further comprising a top metallic plate coupled to a second surface of the second insulative layer, wherein the second surface of the second insulative layer is opposite the first surface of the second insulative layer.

3. The package of claim 1, wherein the semiconductor devices include one of an IGBT, diode, MOSFET, a SiC device and a GaN device.

4. The package of claim 1, wherein the electrically insulative layer is one of a ceramic insulated layer and a laminate insulated layer.

5. The package of claim 1, wherein the second insulative layer is one of a ceramic insulated layer and a laminate insulated layer.

6. The package of claim 1, wherein the package does not comprise one of wire bonds and clips.

7. The package of claim 1, wherein the metallic base plate is patterned.

8. The package of claim 2, wherein the top metallic plate is patterned.

* * * * *